US006993672B2

(12) United States Patent
Takahashi et al.

(10) Patent No.: US 6,993,672 B2
(45) Date of Patent: Jan. 31, 2006

(54) TIMING ADJUSTMENT OF CLOCK SIGNALS IN A DIGITAL CIRCUIT

(75) Inventors: Eiichi Takahashi, Tsukuba (JP); Masahiro Murakawa, Tsukuba (JP); Kenji Toda, Tsukuba (JP); Tetsuya Higuchi, Tsukuba (JP)

(73) Assignees: Agency of Industrial Science & Technology, Tokyo (JP); Evolvable System Research Institute, Inc., Tokyo (JP)

( * ) Notice: Subject to any disclaimer, the term of this patent is extended or adjusted under 35 U.S.C. 154(b) by 125 days.

(21) Appl. No.: 10/668,357

(22) Filed: Sep. 24, 2003

(65) Prior Publication Data

US 2004/0059955 A1     Mar. 25, 2004

Related U.S. Application Data

(63) Continuation of application No. 09/519,463, filed on Mar. 6, 2000, now Pat. No. 6,658,581.

(30) Foreign Application Priority Data

Mar. 29, 1999 (JP) .................................. 11-86167
Jan. 12, 2000 (JP) .................................. 2000-3449

(51) Int. Cl.
*H04L 7/00* (2006.01)
*G06N 3/12* (2006.01)
(52) U.S. Cl. ..................................... 713/401; 706/13
(58) Field of Classification Search ................ 713/401, 713/400; 406/13
See application file for complete search history.

(56) References Cited

U.S. PATENT DOCUMENTS 4,286,330 A * 8/1981 Isaacson ...................... 712/223
4,697,242 A    9/1987 Holland et al. ............... 706/13

(Continued)

FOREIGN PATENT DOCUMENTS

JP        A-3-117210        5/1991

(Continued)

OTHER PUBLICATIONS

AIST Press Release, "AIST Team Develops Genetic Algorithm-Based Method to Adjust Clock Timing that Allows Power Consumption to be Halved in High-Speed LSIs: Adjusted Clock Timing Provides Enhanced Clock Frequencies and Reduced Design Times", Jun. 11, 2003 (in Japanese w/English Summary).

(Continued)

*Primary Examiner*—Lynne H. Browne
*Assistant Examiner*—Eric Chang
(74) *Attorney, Agent, or Firm*—Oliff & Berridge, PLC

(57) ABSTRACT

A digital system that performs a specified function by performing digital processing according to one or more clock signals is provided with a plurality of delay elements which are respectively inserted in a plurality of clock circuits that supply the clock signals in the digital system and each of which is composed of a circuit element that changes a delay time according to a value indicated by a control signal, and a plurality of holding circuits that hold a plurality of control signals to be given to the plurality of delay elements. In the plurality of holding circuits, a value of the control signals held by these holding circuits is changed by external devices according to a probabilistic search technique so that the digital system operates correctly in relation to operation timing.

36 Claims, 30 Drawing Sheets

U.S. PATENT DOCUMENTS

| | | | |
|---|---|---|---|
| 4,796,259 A | 1/1989 | Troy | 714/731 |
| 5,077,677 A | 12/1991 | Murphy et al. | 706/62 |
| 5,224,056 A | 6/1993 | Chene et al. | 716/7 |
| 5,475,830 A | 12/1995 | Chen et al. | |
| 5,506,959 A | 4/1996 | Cockburn | 714/42 |
| 5,719,515 A | 2/1998 | Danger | 327/270 |
| 6,269,451 B1 | 7/2001 | Mullarkey | 713/401 |
| 6,327,552 B2 | 12/2001 | Nemani et al. | 703/2 |
| 6,480,832 B2 * | 11/2002 | Nakisa | 706/13 |
| 6,578,176 B1 | 6/2003 | Wang et al. | 716/2 |

FOREIGN PATENT DOCUMENTS

| | | |
|---|---|---|
| JP | A-4-23172 | 1/1992 |
| JP | A-6-3419 | 1/1994 |
| JP | A-6-75018 | 3/1994 |
| JP | A-6-295319 | 10/1994 |
| JP | A-7-134700 | 5/1995 |
| JP | A-9-325949 | 12/1997 |
| JP | A-9-330350 | 12/1997 |
| JP | A-10-21279 | 1/1998 |
| JP | A-10-111861 | 4/1998 |

OTHER PUBLICATIONS

U.S. Appl. No. 09/397,636, filed Sep. 1999, Tetsuya Higuchi et al.

* cited by examiner

TR5

Mutation

TR6

TIMING ADJUSTMENT OF CLOCK SIGNALS IN A DIGITAL CIRCUIT

This is a Continuation of Application Ser. No. 09/519,463 filed Mar. 6, 2000 now U.S. Pat. No. 6,658,581. The entire disclosure of the prior application is hereby incorporated by reference herein in its entirety.

BACKGROUND OF THE INVENTION

1. Field of Invention

The present invention relates to a single or a plurality of digital systems operating synchronously with a single or a plurality of clock signals, a method for adjusting in timing the clock signals of such a digital system, and a recording medium having a processing program recorded on it, the processing program being executed in the adjusting method.

Particularly, the present invention is very effective in case that the number of digital circuit elements being components of a digital system or in case that the frequency of a clock signal is high.

2. Description of Related Art

A digital system is ordinarily composed of logic elements of three kinds which are an AND element, an OR element and a NOT element, and a memory element called a flip-flop to memorize either of the two states (1 bit) of true (logic value "1") and false (logic value "0").

The most basic flip-flop is composed of three terminals of one input terminal, one output terminal and a clock terminal, and has a function which copies a digital signal of the input terminal to the output terminal at rising of a digital signal called a clock signal applied to the clock terminal and holds this digital signal until rising of the next clock signal.

Generally, a digital system operating according to a finite number of clock signals is called a synchronous circuit, in which the time difference between clock signals reaching the clock terminals of the respective flip-flops has an influence upon operation of the whole system. Generally, a signal line to supply a clock signal to each flip-flop often has a buffer inserted in the course of it or adopts a special circuit contrived in physical wiring, which is called a clock circuit here.

For example, while a time difference of 1 ns is a difference of 1% in case of a clock frequency of 10 MHz, namely, in case of a clock cycle of 100 ns, the same time difference of 1 ns is a difference of 10% in case of a clock frequency of 100 MHz, namely, in case of a clock cycle of 10 ns and needs to be compensated. In short, the higher a clock frequency is, the more accurate a timing adjusting technique needs to be.

A conventional countermeasure to counter a clock timing error in a digital system includes such two ways as;

(1) a countermeasure technique in which a designer performs a manual adjustment so as to make a clock timing error as small as possible at the time of designing a digital system, and (2) a countermeasure technique of providing an adjusting circuit compensating for a clock timing error in a clock circuit in a digital system.

However, countermeasure (1) cannot solve the following problems. That is to say, electronic circuit elements such as a transistor, a resistor and a capacitor vary respectively in characteristic, and variation of the respective elements is not apparent until a system is actually formed. This is a characteristic particularly remarkably appearing in elements in an integrated circuit. It is a clock timing that is most influenced by this variation, which determines the upper limit of the operating frequency of a digital synchronous system.

In such a way, since variation in these elements cannot be completely grasped at the time of design of a digital system, a technique has been taken which designs and manufactures it allowing a certain range of variation or which measures an actual degree of variation by repeating its trial manufacture. However, this technique has apparently a limit and has not been able to utilize the characteristic of each element to its limit.

As another problem, a manual adjustment has a limit in scale of a handleable circuit, and has not been able to adjust the whole of a large-scale digital system such as a computer system as a practical problem. And a technique of separating a large-scale problem into partial problems, the technique being a familiar method in handling a large-scale problem is not preferable due to limiting a range of adjustment.

A problem in countermeasure (2) is that although an adjusting circuit is inserted, with the increase of a circuit scale the adjusting and search space becomes more extensive and results in making it impossible to perform adjustment within a practical time. On the other hand, an adjusting circuit which can perform adjustment within a practical time can adjust only a small part of a digital system and its effect is extremely limited.

In case that the above-mentioned digital system is made as an integrated circuit, it is further characterized by the following two points.

The first point is that the interior of an integrated circuit cannot be modified and must be all determined at design. Thereupon, a technique of inserting an adjusting circuit is taken, but since the adjusting and search space becomes very extensive, it is impossible to perform adjustment in consideration of operation of the whole circuit. If a new technique of the present invention as described later is not used, it is impossible to perform a timing adjustment in consideration of operation of the whole circuit after the integrated circuit chip has been manufactured.

The second point is that elements in an integrated circuit chip are large in variation and variation in parameters (the values of a resistor, a capacitor, etc. and characteristics of a transistor) of the internal elements becomes apparent only after the integrated circuit chip has been manufactured. Therefore, the variation in them has a large influence upon a clock timing, and such a new technique as the present invention described later is indispensable in case of requiring accurate element parameter values in order to utilize characteristics of the elements to their limits.

In a case that a digital system is an ordinary hardware design data library or a hardware design data library which is considered as an object of intellectual property rights, called IP, and is intended to be used by a third party, its functions and interface requirements are publicly disclosed, but more detailed information than an equivalent circuit related to its internal structure may not be publicly disclosed.

In a case of using such IP in an integrated circuit having a high clock frequency, an accurate timing adjustment reaching the interior being treated as an object of the IP is indispensable. However, since the interior is often a black box due to IP rights as described above, in order to manufacture an integrated circuit operating at a high clock frequency while keeping such rights, it is necessary to provide a clock circuit to generate data of the optimum input and output timing for each IP at an external circuit side. However, since even if the same IP is used, the optimum input/output timing varies in each chip, the prior technique has been unable to manufacture such an integrated circuit.

Additionally, most of the present digital systems use a CMOS technology and in case that a digital system is formed using a CMOS technology, most of a power source current flows when each digital signal changes (from logic value "0" to logic value "1" or from logic value "1" to logic value "0").

If a number of digital signals change at the same time, therefore, a large power source current flows instantaneously and insufficiency of the power capacity makes a power source voltage change and, in its turn, may cause an erroneous operation.

Furthermore, in comparison with a case where a small current flows continuously, when a large current flows instantaneously, the power consumption is made larger and a larger-capacity power source and power feeding lines need to be prepared and these result in making a digital system larger in size.

To decrease an influence of the simultaneous change of digital signals can be attained by finely adjusting the respective signals in timing, namely, the respective flip-flops in timing within a range where the whole system operates correctly, but a conventional technique has been unable to perform such an accurate timing adjustment in consideration of operation of the whole system.

Additionally, an unwanted electromagnetic emission (EMI) generated from a digital system, which has such an influence as making another digital system around it erroneously operate, should be suppressed. This problem is particularly serious in case that a digital system is packaged as a circuit board, and is regulated by various laws of various countries. The EMI is generated when a digital signal changes (from logic value "0" to logic value "1" or from logic value "1" to logic value "0"), and an EMI having a large peak power is generated when a number of digital signals change all at once.

As one way for suppressing this, there is a method of reducing the number of digital signals changing at the same time, namely, the number of flip-flops changing at the same time, but it has been impossible to accurately adjust in timing the flip-flops of the whole digital system within a range where the whole digital system correctly operates at a specified clock frequency by means of a conventional technique.

SUMMARY OF THE INVENTION

For such reasons a new method for automatically performing a clock signal timing adjustment for each digital system is needed particularly in a large-scale and high-speed system, and the present invention has been made in order to advantageously solving such problems.

In order to attain the above-mentioned objects, a digital system of the present invention according to claim 1 is a digital system performing a specified function by performing a digital process according to a single clock signal or a plurality of clock signals, being provided with;

a plurality of delay elements which are inserted respectively in a plurality of clock circuits supplying the clock signals in the digital system and each of which is composed of a circuit element changing its delay time according to a value indicated by a control signal, and a plurality of holding circuits for holding a plurality of control signals to be given to the plurality of delay elements, wherein;

the plurality of holding circuits have the plurality of control signals obtained by changing the plurality of control signals which these holding circuits hold by means of an external device according to a probabilistic search technique so that the digital system operates correctly in relation to operation timing.

Additionally, a method for adjusting a clock signal of a digital system according to claim 12 is a method for adjusting in timing a single clock signal or a plurality of clock signals of a digital system performing a specified function by performing a digital process according to the single clock signal or the plurality of clock signals, the method comprising the steps of;

inserting a plurality of delay elements respectively in a plurality of clock circuits supplying the clock signals in the digital system, forming the plurality of delay elements respectively out of circuit elements each changing its delay time according to a value indicated by a control signal, making a plurality of holding circuits provided in the digital system hold a plurality of control signals to be given to the plurality of delay elements, and changing the values of the plurality of control signals which the plurality of holding circuits hold by means of an external device according to a probabilistic search technique so that the digital system operates correctly in relation to operation timing.

In such a digital system and in such a method for adjusting a clock signal of the digital system;

a plurality of control signals which a plurality of holding circuits hold are respectively given to delay elements which are inserted respectively in a plurality of clock circuits supplying a single or a plurality of clock signals in a digital system and each of which is composed of a circuit element changing its delay time according to a value indicated by a control signal, and each delay element delays properly and supplies a clock signal to a basic circuit according to a value indicated by each of these control signals. Additionally, an external device changes the values of the plurality of control signals which the plurality of holding circuits hold according to a probabilistic search technique so that the digital system operates correctly in relation to operation timing. "Delay" in the present invention includes also negative delay, namely, advancing in addition to positive delay, namely, delaying.

According to a digital system of the present invention and a method for adjusting a clock signal of the digital system of the present invention, in case that characteristics (delay characteristic and the like) of circuit elements associated with the specified function cannot be accurately grasped, or in case that some error occurs in characteristic of the circuit elements in a manufacturing process, or in case that non-uniformity in quality or error in design occurs in clock circuits, or even in case that a basic circuit in a digital system is made to be a black box like the above-mentioned IP and its composition is not clear, since it is possible to perform adjustment so that the digital system can correctly operate by absorbing a timing error of a clock signal, it is possible to obtain a higher performance related to the function than a prior art with a less design effort than the prior art, and obtain a larger-scale and higher-speed digital system than a digital system obtained by the prior art, and further prevent deterioration of the performance of the digital system caused by variation of the circuit elements and the like.

Additionally, according to a digital system of the present invention and a method for adjusting a clock signal of the digital system of the present invention, since it is possible to accurately adjust in timing the flip-flops of the whole digital system and slightly shift the flip-flops in operation timing within a range where the whole digital system correctly operates, it is possible also to suppress the increase in size of the digital system due to the increase of power consumption and the occurrence of unwanted electromagnetic emission (EMI), caused by simultaneous change of digital signals.

Hereupon, what degree a digital system correctly operates to can be represented by an evaluation function F having as parameters the delay values of all adjustable delay elements. To operate correctly a digital system is equivalent to finding a solution of the above-mentioned evaluation function F. The inventors of this application have found that a genetic algorithm can be applied to a clock timing adjustment of a digital system, paying their attention to this point.

The genetic algorithm is one of probabilistic search techniques and an algorithm which (1) acts effectively in a wide-area search, (2) does not need derivative information such as differential values other than an evaluation function F, and (3) has an easy implementability. In the present invention, therefore, as described in claims 2 and 13, a genetic algorithm may be used for changing a plurality of control signals by means of the above-mentioned external device.

Additionally, although a clock circuit is often implemented so as to have a tree structure, in addition to a method of arranging adjustable delay elements only at leaf parts of the tip of a tree structure as described above, namely, only at flip-flop parts, a method of arranging them also at branch points in the course of a tree structure is conceivable. In this case, an adjustable delay element arranged at a branch point functions so as to add a delay to adjustable delay elements existing ahead of this point and has a function of making smaller the delay elements being at the tip parts. Therefore, it has the possibility of making smaller the total size necessary for implementing adjustable delay elements.

On the other hand, in recent years, a genetic programming obtained by applying a contrivance making it possible to handle a chromosome of a tree structure to a genetic algorithm has been also known. In the present invention, therefore, in a case that adjustable delay elements are arranged along a tree structure of signal lines of a clock in such a way, a genetic programming may be used for changing a plurality of control signals by means of the external device, as described in claims 3 and 14.

Additionally, in the present invention, as described in claims 4 and 15, a control signal may be changed by the external device as raising the frequency of a clock signal in stages, and by doing so it is possible to operate a digital system at a higher clock frequency, in its turn, at a more high-speed operating state.

Additionally, a digital system of the present invention according to claim 5 is characterized by being provided with a setting device in the digital system itself instead of using an external device in the digital system according to claim 1. A method for adjusting a clock signal of a digital system of the present invention according to claim 16 is characterized by being provided with a setting device in the digital system itself instead of using an external device in a method for adjusting a clock signal of a digital system according to claim 12.

According to such a digital system of the present invention and such a method for adjusting a clock signal of a digital system of the present invention, the same action and effect as the previous digital system and method for adjusting a clock signal of a digital system can be obtained. Furthermore, since a setting means which the digital system itself has is used instead of an external device, further action and effect of making it possible to perform adjustment by a digital system itself at any time and at any place can be obtained.

Also, in a digital system and a clock signal adjusting method of the present invention, as described in claims 6 and 17, a genetic algorithm may be used for changing a plurality of control signals by means of the external device.

Also, in a digital system and a clock signal adjusting method of the present invention, as described in claims 7 and 18, a genetic programming may be used for changing a plurality of control signals by means of the external device.

Furthermore, in a digital system and a clock signal adjusting method of the present invention, as described in claims 8 and 19, a control signal may be changed by the setting means as raising the frequency of a clock signal in stages.

Additionally, a digital system of the present invention and a digital system in a method for adjusting a clock signal of a digital system of the present invention as described above may be formed as an integrated circuit, as described in claims 9 and 20, and by doing so it is possible to optimally adjust a clock signal in an integrated circuit in which variation of circuit elements is not apparent until the integrated circuit is actually manufactured.

Additionally, a digital system of the present invention and a digital system in a method for adjusting a clock signal of a digital system of the present invention as described above may have a pipeline structure, as described in claims 10 and 21, and if doing so, since it is possible to perform adjustment in parts and in stages as utilizing a data dependent relation of a pipeline structure, it is possible to reduce an adjusting and search space and shorten an adjusting time.

Furthermore, a digital system of the present invention and a digital system in a method for adjusting a clock signal of a digital system of the present invention as described above may be formed as a circuit board, as described in claims 11 and 22, and if doing so, it is possible to absorb a slippage in clock timing caused by non-uniformity in constituent elements or constituent materials of a clock circuit in a digital circuit board manufacturing process or errors in design and adjust the digital circuit board so that it performs no erroneous operation.

Additionally, a digital system of the present invention as described above and the external device and the setting means in a method for adjusting a clock signal of a digital system of the present invention may be each composed of a computer such as a personal computer, a microcomputer or the like, as described in claims 23 and 24, and if doing so, it is possible to easily and securely perform in a short time a process of changing the values of a plurality of control signals which a plurality of holding circuits hold according to a probabilistic search technique so that the digital system operates correctly in relation to operation timing.

Furthermore, a recording medium of the present invention according to claim 25 is characterized by having a processing program recorded on it, which processing program is executed by an electronic computer and changes the values of a plurality of control signals which a plurality of holding circuits hold according to a probabilistic search technique so that a digital system operates correctly in relation to operation timing in a method for adjusting a clock signal of a digital system as described in claim 23 or 24.

According to such a recording medium, it is possible to record and store a processing program to be executed by an electronic computer for a digital system of the present invention and for a method for adjusting a clock signal of a digital system of the present invention and adjust a clock signal at an arbitrary place. As such a recording medium, a data recording medium such as a hard disk, a CD-ROM, an optical disk and the like, and a memory element such as a ROM, a RAM and the like can be used in addition to a flexible disk.

DETAILED DESCRIPTION OF PREFERRED EMBODIMENTS

Embodiments of the present invention are described in detail with reference to the drawings using examples in the following.

The present invention can be applied to various digital systems each of which operates using a single or a plurality of clock signals. That is to say, according to the present invention, it is possible to adjust a clock signal by providing a plurality of adjusting points for timing in a clock circuit of a digital system to be adjusted.

In the first embodiment described below, a case where the present invention is generally applied to a digital system which operates using a single or a plurality of clock signals is described.

Figure 1:
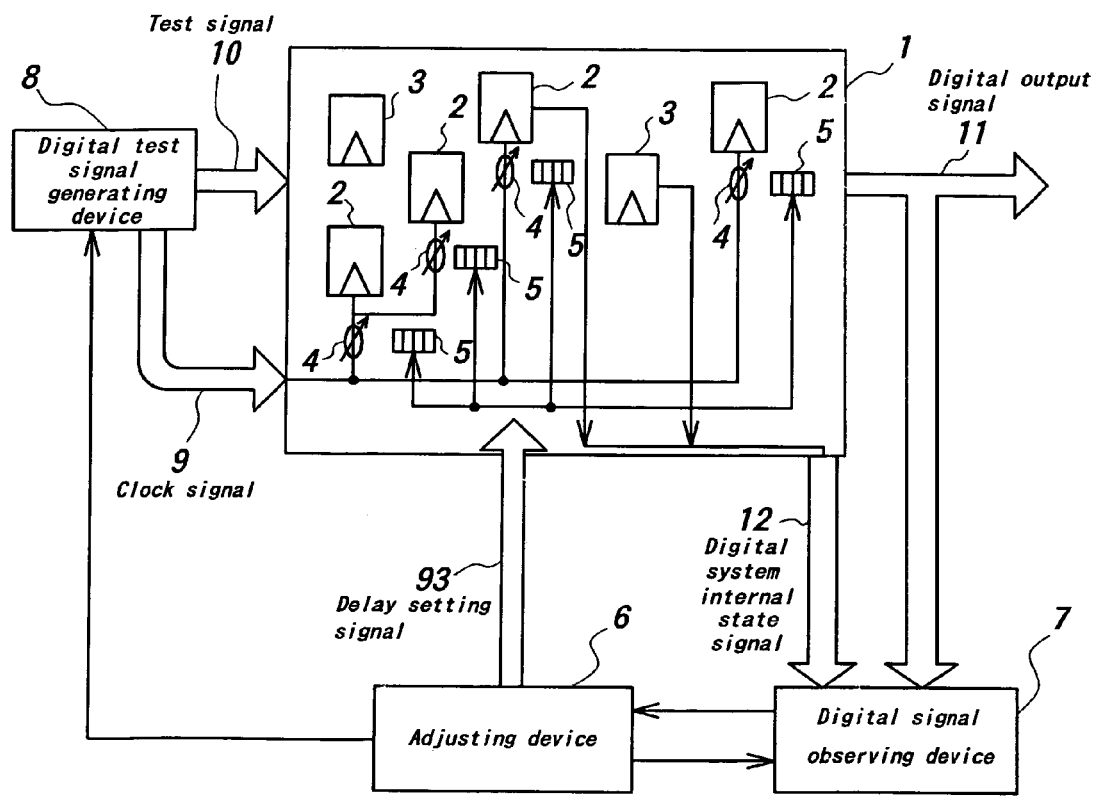
FIG. 1 is a composition diagram schematically showing a first embodiment of a digital system of the present invention applied to a general digital system.

Hereupon, FIG. 1 is a composition diagram showing schematically a first embodiment of a digital system of the present invention applied to a general digital system.

Since a failure caused by a timing error of a clock signal in a digital system makes long a design process of the digital system and limits the usable performances of elements forming the digital system, it limits the performance of the digital system itself and prevents the cost reduction.

Therefore, a clock signal adjusting method of the present invention for performing a timing adjustment of a clock signal for each of individual digital systems is indispensable.

In FIG. 1, symbol 1 represents a digital system which, for example, forms a microcomputer and the like, and performs a specified function such as data processing and the like on the basis of a given program, 2 represents a flip-flop which needs a timing adjustment of a clock signal, and 3 represents a flip-flop which needs no timing adjustment. And 4 represents an adjustable delay element capable of changing a clock in timing according to the value of a register and 5 represents a register holding a delay setting value for 4.

The delay element 4 is inserted between the clock terminal of the flip-flop 2 and a clock circuit supplying a clock signal to the clock terminal. And the register 5 is connected to the delay element 4 and changes the delay value of the delay element 4.

The flip-flop 2 to be adjusted and the flip-flop 3 not to be adjusted (needing no adjustment) each are components of the digital system 1.

In FIG. 1, symbol 5 is the register for holding the setting value of the adjustable delay element 4, symbol 7 is an observing device for observing digital output signals of the digital system 1 and the internal state of the digital system 1, and 8 is a device for generating a test signal and a clock signal for adjusting the digital system 1 according to a method of the present invention.

The register 5 is a storage circuit composed of a general D flip-flop, T flip-flop, SR flip-flop or JK flip-flop, or a register circuit, a memory element storing a state according to a clock signal, a loop-shaped combination circuit or the like.

Additionally, symbol 6 is an adjusting device which is connected to the digital signal generating device, makes the digital signal generating device 8 start generating a signal to the digital system 1, and at the same time, is connected to the digital test signal observing device 7 and makes the digital test signal observing device 7 observe an output signal 11 of the digital system 1 and a digital system internal state signal 12 showing the internal state of the digital system 1, as described later.

This adjusting device 6 computes the delay time of the adjustable delay element 4 according to an adjusting method of the present invention, and writes the delay setting value into the register 5.

In this embodiment, the adjusting device 6, the digital signal observing device 7 and the digital test signal generating device 8 each are an external device.

The digital system 1 in this embodiment may be formed as an integrated circuit or may be formed as a circuit board.

Further, the digital system 1 in this embodiment may be formed as a single system or may be composed of a plurality of systems.

Furthermore, the digital system 1 in this embodiment may be composed of a plurality of systems and include a communication path inside it, or may be formed as a single system and include a bus-shaped communication path inside it.

Furthermore, the digital system 1 in this embodiment may be formed as a multi-chip module or a hybrid integrated circuit.

Still further, the digital system 1 in this embodiment may be formed as a hardware design data library or a hardware library which is treated as an object of IP (Intellectual Property) and is intended to be used by a third party.

The flip-flop 2 to be adjusted and the flip-flop 3 not to be adjusted each are a storage circuit composed of a general D flip-flop, T flip-flop, SR flip-flop or JK flip-flop, or a register circuit, a memory element storing a state according to a clock signal, a loop-shaped combination circuit or the like, and function as a component of the digital system 1.

That is to say, in the digital system 1, the flip-flop 2 to be adjusted and the flip-flop 3 not to be adjusted are properly connected to a combination circuit inside the digital system 1 and store the internal state according to the clock signal.

In the above-mentioned system, the flip-flop 2 to be adjusted is a flip-flop to be adjusted by the method of the present invention, and the flip-flop 3 not to be adjusted is a flip-flop not to be adjusted by the method of the present invention, and the method does not care whether they are adjusted by another method, for example, a conventional technique such as a timing adjustment based on a simulation result or the like at design of the digital system 1, a timing adjustment based on an experimental manufacture result, a timing adjustment by inserting a fixed value delay element into a data path or a clock circuit or the like.

The clock delay time of the flip-flop 2 to be adjusted is a delay time added by the adjustable delay element 4 inserted between the clock terminal of the flip-flop 2 and a clock circuit, and a clock signal supplied to the clock terminal of the flip-flop 2 to be adjusted is delayed in timing by its delay time in comparison with the case where the adjustable delay element 4 is not inserted.

The digital system 1 to be an object of adjustment is provided with the flip-flop 2 to be adjusted and the flip-flop 3 not to be adjusted as described above, and this embodiment makes the digital system 1 correctly operate by finely adjusting the delay time of the flip-flop 2 to be adjusted, namely, the delay setting value of the adjustable delay element 4 connected to the clock terminal of the flip-flop 2 to be adjusted after the digital system 1 has been manufactured.

By the way, generally the delay setting values of the adjustable delay elements 4 have an influence upon each other.

Figure 2:
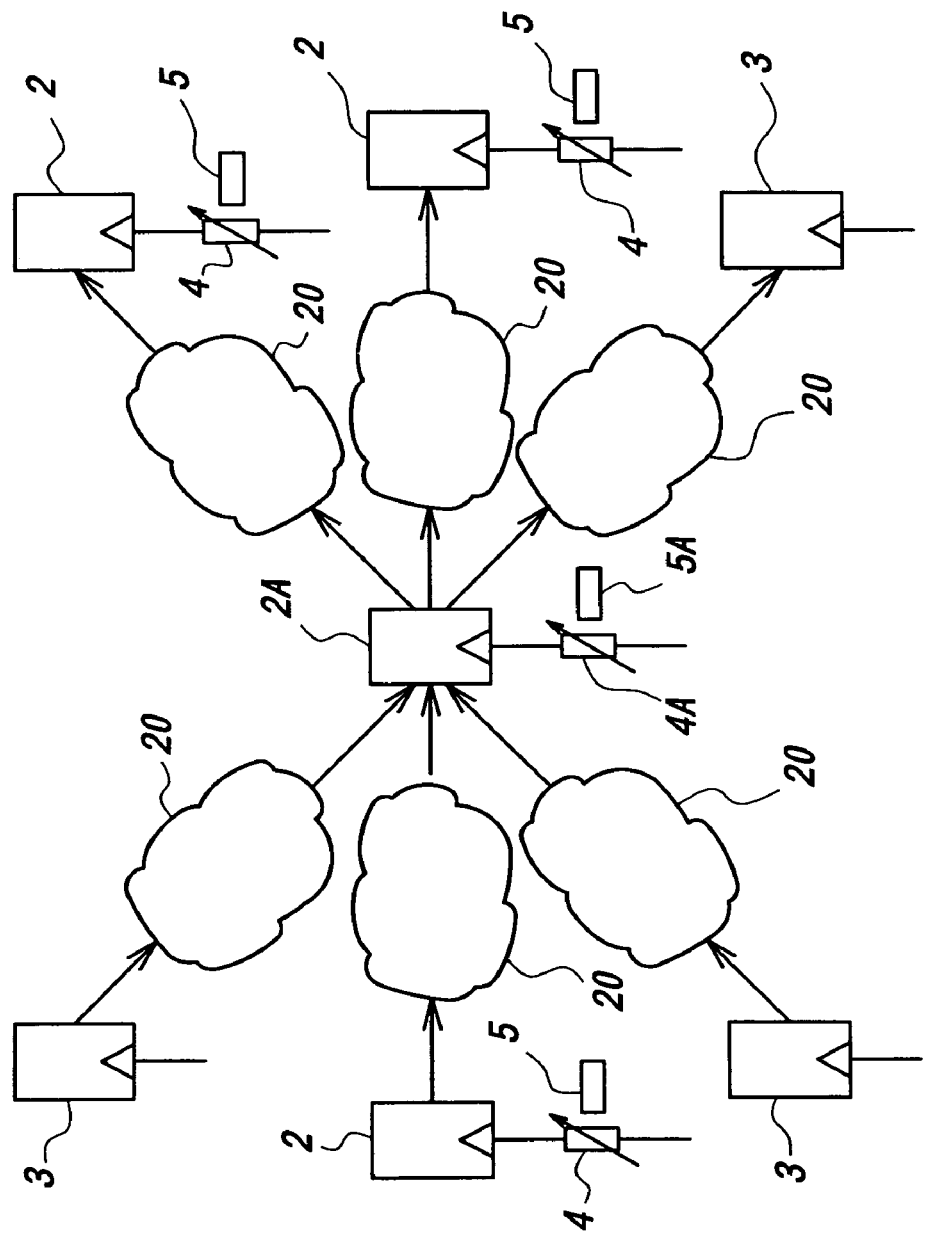
FIG. 2 is an explanatory diagram showing influence of adjustment of delay setting values of delay elements in a digital system.

As shown in FIG. 2, to adjust the delay setting value of a delay element 4A connected to a flip-flop 2A to be adjusted has an influence upon other flip-flops 2 to be adjusted which are each connected to the input/output terminal of this flip-flop 2A with only a combination circuit 20 between them.

In many cases like such a way, an adjusting and search space results in generating a combinatorial explosion. Therefore, an adjusting technique described later using a probabilistic search technique including a genetic algorithm based on the present invention is very effective.

In this embodiment, the delay setting value of the adjustable delay element 4 connected to the clock terminal of a flip-flop 2 to be adjusted is adjusted so that the digital system 1 correctly operates.

Figure 23:
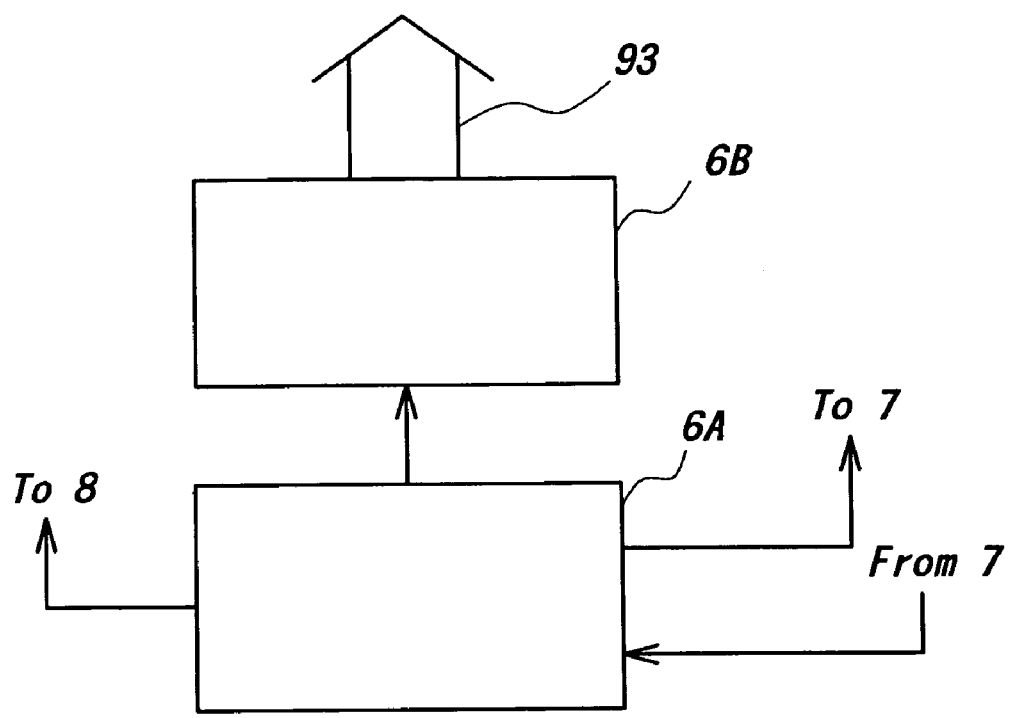
FIG. 23 is a composition diagram showing a composition example of an adjusting device in the embodiment.

A composition example of the adjusting device 6 is shown in FIG. 23. In FIG. 23, symbol 6A is an adjusting algorithm executing device for executing an adjusting procedure according to a method of the present invention, and 6B is a delay setting device for writing a delay setting value into the register 5 of the digital system 1.

In adjustment in this embodiment, the delay setting device 6B sets a delay setting value computed by the adjusting algorithm executing device 6A into the register 5 of the digital system 1 through a delay setting signal 93. The delay setting signal 93 is a digital value having the same bit width as that of the register 5, and controls the delay time generated by the adjustable delay element 4.

The adjusting algorithm executing device 6A searches the optimum value as a delay setting value of the register 5 according to a genetic algorithm. The adjusting device 6 may be concretely composed of an electronic computer such as a personal computer, a microcomputer or the like, and may be also composed of a programmable LSI disclosed in Japanese Patent Laid-Open Publication No.Hei 9-294,069 or a circuit disclosed in a paper entitled "Implementation of a Structure Learning Circuit of a Neural Network by GA" by Kajitani et al., (The Journal of the Japanese Neural Network Society, Vol.5, No.4, pp.145–153, 1998).

In the electronic computer, a program for implementing a function of the adjusting algorithm executing device 6A is stored in a recording medium such as a hard disk, a ROM (read only memory), a flash memory, an optical disk, a magneto-optical disk, a magnetic disk or the like.

In FIG. 1, symbol 9 is a clock signal generated by the digital test signal generating device 8 and symbol 10 is a test signal generated by the digital test signal generating device 8, and these signals are inputted into the digital system 1.

In the same figure, symbol 11 is a digital output signal outputted by the digital system 1, symbol 12 is a digital system internal state signal obtained by taking the outputs of some or all flip-flops, and these signals are inputted into the digital signal observing device 7. Depending on the structure of a digital system 1, the digital system 1 may be adjusted according to a method of the present invention without using a digital system internal state signal 12.

Figure 24:
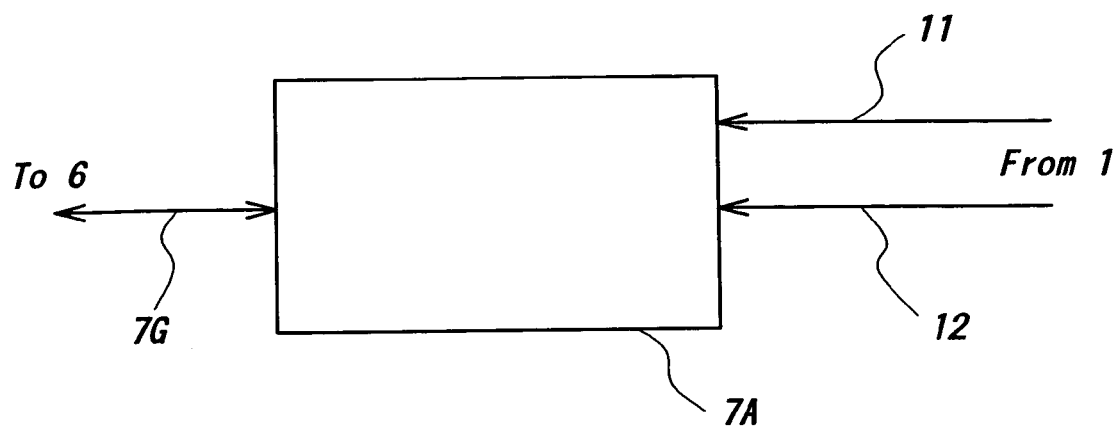
FIG. 24 is a composition diagram showing a composition example of a digital signal observing device in the embodiment.

A composition example of the digital signal observing device 7 is shown in FIG. 24. The digital signal observing device 7 is composed of only a logic analyzer 7A. A logic analyzer is generally a measuring device for observing digital signals in a digital system.

The logic analyzer 7A and the digital system 1 are connected to each other through a measuring probe of the logic analyzer 7A, and the logic analyzer 7A and the adjusting device 6 are connected to each other through a GP-IB interface 7G. Signals sent from the digital system 1 through the measuring probe to the logic analyzer 7A are the digital output signal 11 and the digital system internal state signal 12.

The digital signal observing device 7 may be composed of a dedicated circuit and may be built in the digital system 1.

The logic analyzer 7A is made to store the values of the digital output signal 11 and the digital system internal state signal 12 in it in case that the digital system 1 has correctly operated and is made to compare them with output of the digital system 1 and compute an evaluation value.

Or the values of the digital output signal 11 and the digital system internal state signal 12 in case that the digital system 1 has correctly operated may be made to be stored in the adjusting device 6, and the values of the digital output signal 11 and the digital system internal state signal 12 from the digital system 1 may be sent to the adjusting device 6 as they are and an evaluation value may be computed by the adjusting device 6.

Figure 25:
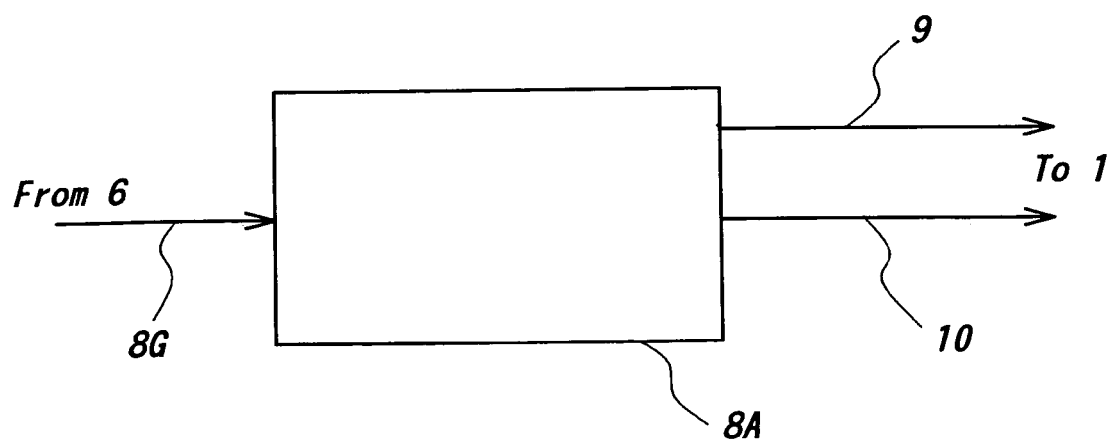
FIG. 25 is a composition diagram showing a composition example of a digital test signal generating device in the embodiment.

A composition example of the digital test signal generating device 8 is shown in FIG. 25. The digital test signal generating device 8 is composed of only a digital signal generator 8A.

The digital signal generator 8A and the digital system 1 are connected to each other through a probe of the digital signal generator 8A, and the digital signal generator 8A and the adjusting device 6 are connected to each other through a GP-IB interface 8G. Signals sent from the digital signal generator 8A through the probe to the digital system 1 are a clock signal 9 and a test signal 10.

The digital signal generator 8A holds a data pattern of a digital signal to be outputted in its internal memory, and outputs it to the digital system 1 as a digital test signal 10 synchronously with a clock signal 9 having a specified frequency.

The digital test signal generating device 8 may be composed of a dedicated circuit and may be built in the digital system 1.

The present invention is particularly effective in case that the total number of adjusting points of flip-flops 2 to be adjusted in a digital system 1 is plural and, in adjusting points of the delay elements 2 as illustrated in FIG. 2, the adjustment of a certain adjustment spot 2A has an influence upon the results of adjustment of a number of other adjusting points and causes a combinatorial explosion in an adjusting and search space.

The digital system 1 of the present invention is greatly characterized by a fact that it uses a plurality of the flip-flops 2 to be adjusted whose clock terminals each are connected to the delay element 4 being capable of being adjusted in delay time according to setting from an external device, searches the optimum delay value by means of a probabilistic search algorithm executed by an adjusting device 6, and does not directly measure the delay time error itself of a clock signal.

Figure 3:
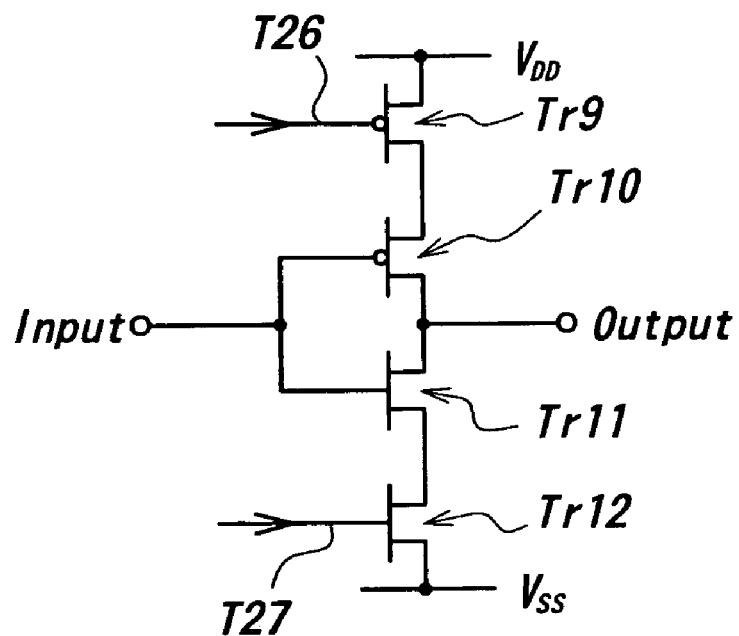
FIG. 3 is a circuit diagram showing a composition example of an adjustable delay element capable of being used in the embodiment.
Figure 4:
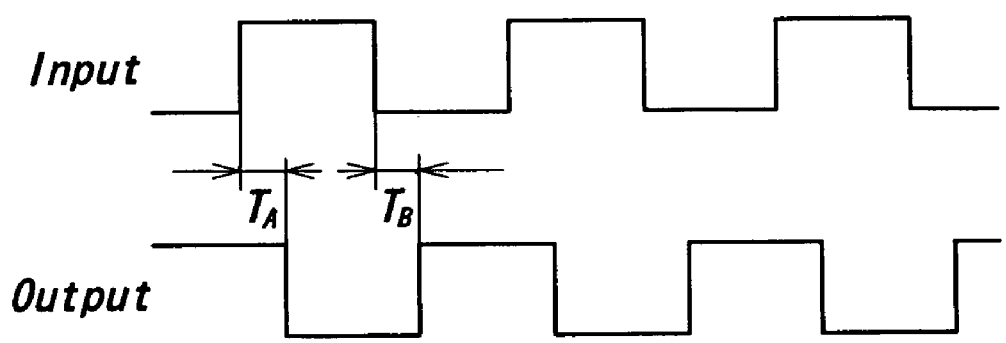
FIG. 4 is an explanatory diagram showing the waveforms of an input signal to a NOT element and an output signal from a NOT element in the circuit shown in FIG. 3.

A composition example in case of changing a delay time (signal transmission timing) by means of the adjustable delay element 4 is shown in FIG. 3. This is a circuit in which Tr9 and Tr10 each being a p-channel FET, and Tr11 and Tr12 each being an n-channel FET are connected in series with one another, and Tr10 and Tr11 function as NOT elements. At this time, since the current value of the circuit is changed according to the resistance values of Tr9 and Tr12, the time for charging and discharging the stray capacity (parasitic capacity) and the load capacity is changed. FIG. 4 shows the waveforms of an input signal (input clock signal) to the NOT elements and an output signal (output clock signal) from the NOT elements. A delay time of TA can be adjusted by a control signal voltage inputted to T27 and a delay time of TB can be adjusted by a control signal voltage inputted to T26.

In case that it is enough to adjust in delay time either of the rise time and the fall time of a clock signal, one of the Tr9 and Tr12 can be omitted.

Other composition examples in case of changing a delay time (signal transmission timing) by means of the adjustable delay element 4 are shown in FIGS. 5 to 8.

Figure 5:
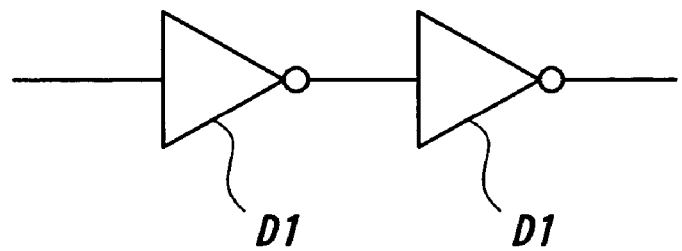
FIG. 5 is a circuit diagram showing another composition example of an adjustable delay element capable of being used in the embodiment.

As shown in FIG. 5, it is possible to generate a delay time of 2 DNs by arranging in cascade two NOT elements D1 each having a unit delay DN.

Figure 6:
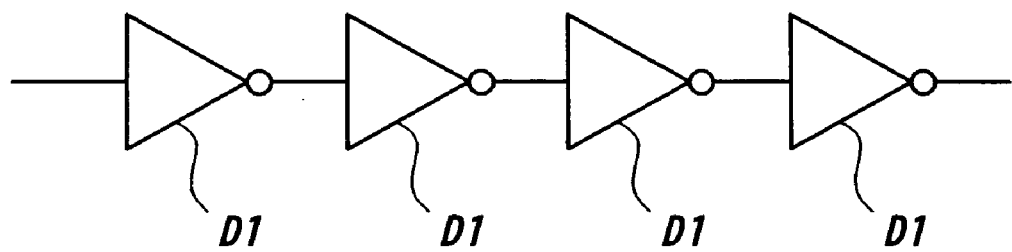
FIG. 6 is a circuit diagram showing a further other composition example of an adjustable delay element capable of being used in the embodiment.

As shown in FIG. 6, it is possible to generate a delay time of 4 DNs by arranging in cascade four NOT elements each having a unit delay DN.

In the same way, it is possible to generate a delay time of "2n×DN" by arranging in cascade NOT elements of 2n in number each having a unit delay DN.

Figure 7:
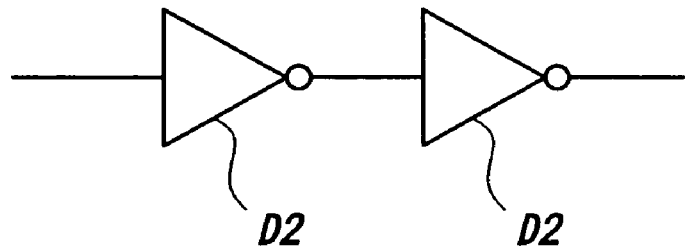
FIG. 7 is a circuit diagram showing a further other composition example of an adjustable delay element capable of being used in the embodiment.

If a NOT element D2 is composed of transistors larger in size, the parasitic capacity of a transistor is increased and a longer delay is generated, and it is possible to change a delay time without increasing the number of elements, as shown in FIG. 7.

Figure 8:
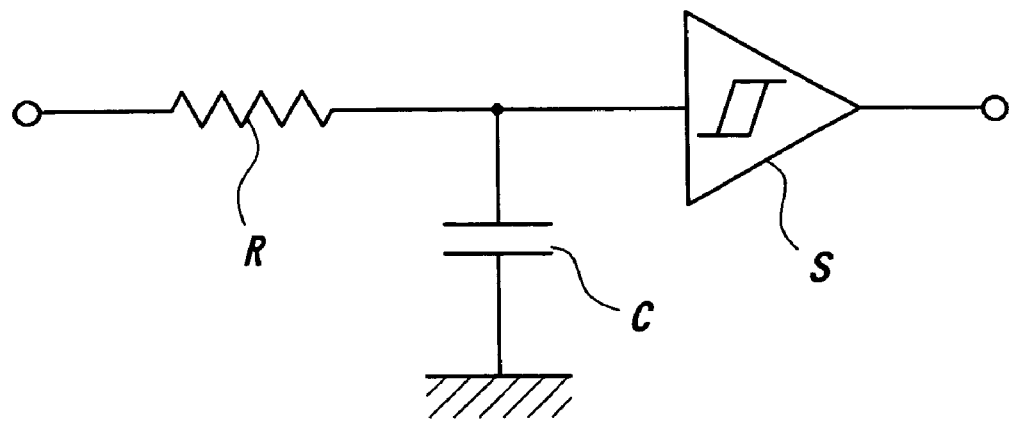
FIG. 8 is a circuit diagram showing a further other composition example of an adjustable delay element capable of being used in the embodiment.

On the other hand, as shown in FIG. 8, a delay circuit can be formed also by forming an integrating circuit using a resistor R and a capacitor C and shaping the output of the circuit in waveform by means of a Schmitt trigger element S and the like. This composition can generate a delay in proportion to the product of the values of the resistor R and the capacitor C.

Further, a long wiring can be used as a delay element utilizing a delay caused by the wiring itself, and in this case a delay being proportional to the length of a wiring can be generated.

Figure 9:
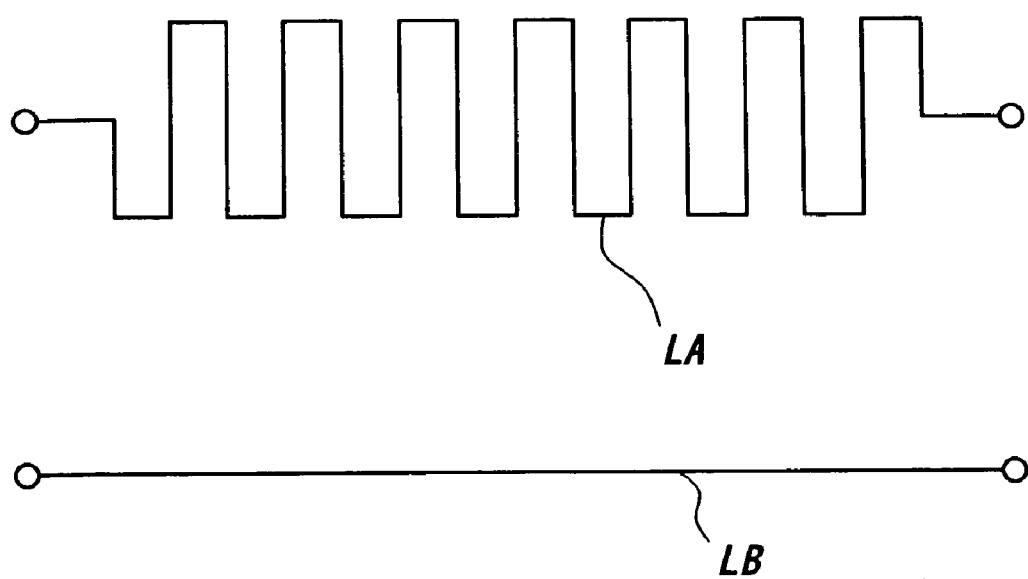
FIG. 9 is a circuit diagram showing a further other composition example of an adjustable delay element capable of being used in the embodiment.

For example, in FIG. 9, a wiring LA of LLA in length shown at the upper side of the figure generates a delay of LLA/LLB times in comparison with a wiring LB of LLB in length having the same width and same material as the wiring LA.

Any of the above-mentioned delay elements has a function of only delaying a clock signal, but it is possible also to generate such a negative delay that advances a clock signal by using a PLL (phase locked loop) circuit or a DLL (delay locked loop) circuit.

Figure 12:
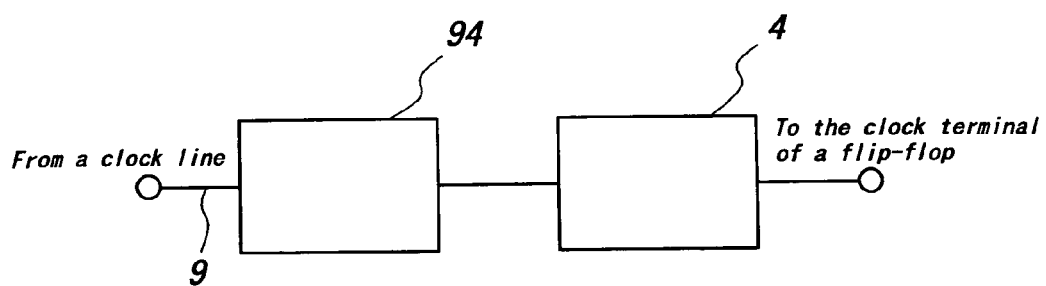
FIG. 12 is a composition diagram showing a composition example of an adjustable delay element which can be used in the embodiment and generates positive and negative delays.

FIG. 12 shows a composition example of an adjustable delay circuit for generating delay in both of the positive and negative directions.

Figure 26:
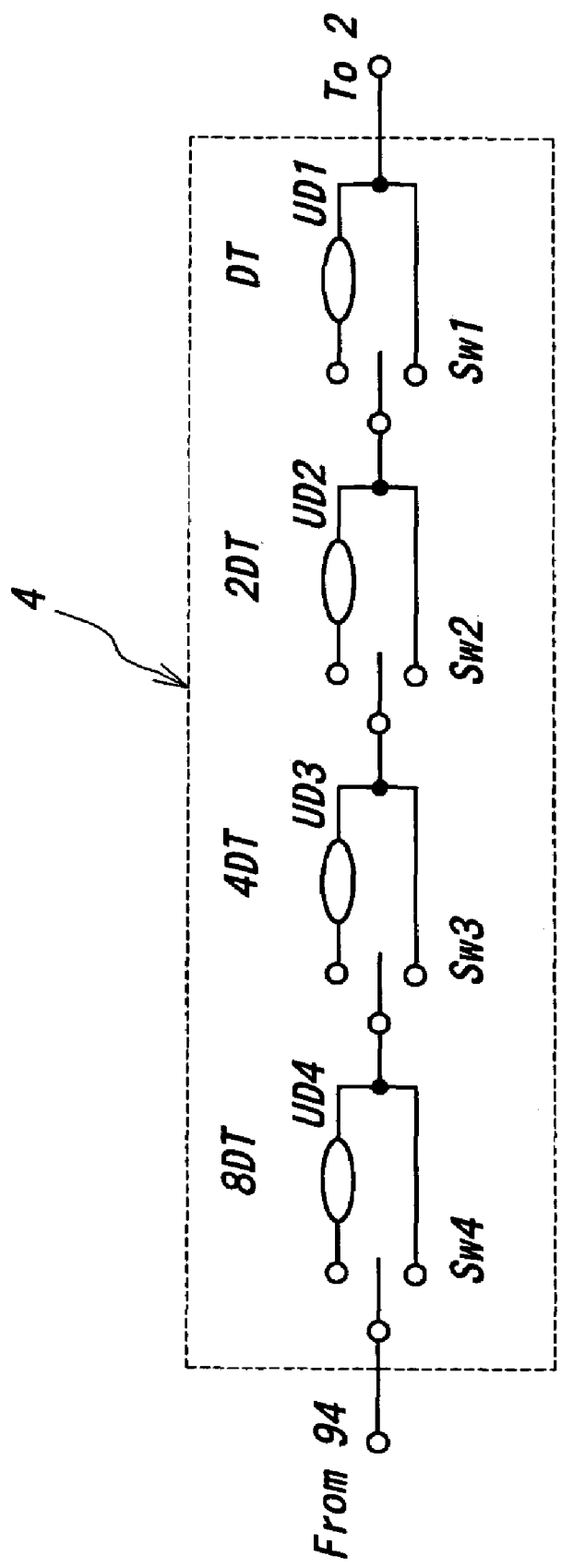
FIG. 26 is a composition diagram showing a composition example of an adjustable delay element in the circuit shown in FIG. 12.

In FIG. 12, symbol 94 is a PLL circuit as described above, 4 is an adjustable delay circuit described later, as shown in FIG. 26. In case that the PLL circuit 94 has a function of advancing a clock by 8 DTs and the adjustable delay circuit 4 has a function of generating a delay of 0 DT to 15 DTs, this circuit can generate a delay of –8 DTs to 7 DTs as a whole.

The adjustable delay element 4 can be composed also by combining the plurality of delay elements.

FIG. 26 is a composition diagram illustrating the composition of the adjustable delay element 4, and this example adjustable delay element 4 corresponds to a case that a register 5 in FIG. 1 holds data of 4 bits.

In this adjustable delay element 4, the bits of a register value held by the register 5 correspond respectively to switch circuits Sw1 to Sw4 through a switch driving circuit not illustrated and the respective switch circuits Sw1 to Sw4 are operated according to the register value, and a delayed clock signal generated as the result is applied to the clock terminal of the flip-flop 2 to be adjusted.

That is to say, the adjustable delay element 4 shown in FIG. 26 is composed of delay elements UD1 to UD4 respectively generating fixed delay times being different in length from one another, and switch circuits Sw1 to Sw4 for using selectively these delay elements UD1 to UD4.

Here, the delay elements UD1 to UD4 and the switch circuits Sw1 to Sw4 corresponding to the respective delay elements UD1 to UD4 are alternately connected in cascade between the clock input from a clock circuit and the clock terminal of the flip-flop 2 to be adjusted. Thereby a delay time generated by the delay elements is added to a clock signal and a clock signal being later in timing by the generated delay time than the original clock signal can be supplied to the clock terminal of the flip-flop 2 to be adjusted.

Hereupon, the delay element UD1 generates a delay time determined in length by design. Additionally, the delay element UD2 generates a delay time being twice that of the delay element UD1 and in the same way, the delay element UD3 generates a delay time being 4 times that of the delay element UD1, and the delay element UD4 generates a delay time being 8 times that of the delay element UD1. For example, the delay element UD1 can be formed as shown in FIG. 5, the delay element UD2 can be formed as shown in FIG. 6, and similarly, UD3 can be formed by connecting eight NOT elements D1 of FIG. 5 in cascade and UD4 can be formed by connecting sixteen NOT elements D1 of FIG. 5 in cascade.

The switch circuits Sw1 to Sw4 corresponding to these delay circuits UD1 to UD4 are on-off controlled on the basis of the register value of the register 5, and when a certain bit out of 4 bits of a register value is "1", a switch circuit corresponding to this bit falls to the delay element side and a delay time generated by the corresponding delay element is added to a clock signal. When a certain bit out of 4 bits of a register value is "0", a switch circuit corresponding to this bit falls to the bypass side, a corresponding delay element is skipped and a delay time generated by the corresponding delay element is not added to a clock signal.

Accordingly, since the delay times generated by the delay elements UD1 to UD4 being respectively set at 1 DT, 2 DTs, 4 DTs and 8 DTs can be added to a clock signal, the delay element 4 can adjust a delay time to be added to a clock signal within a range of 0 to 15 DTs in delay time according to combination of the states of the switch circuits.

Figure 10:
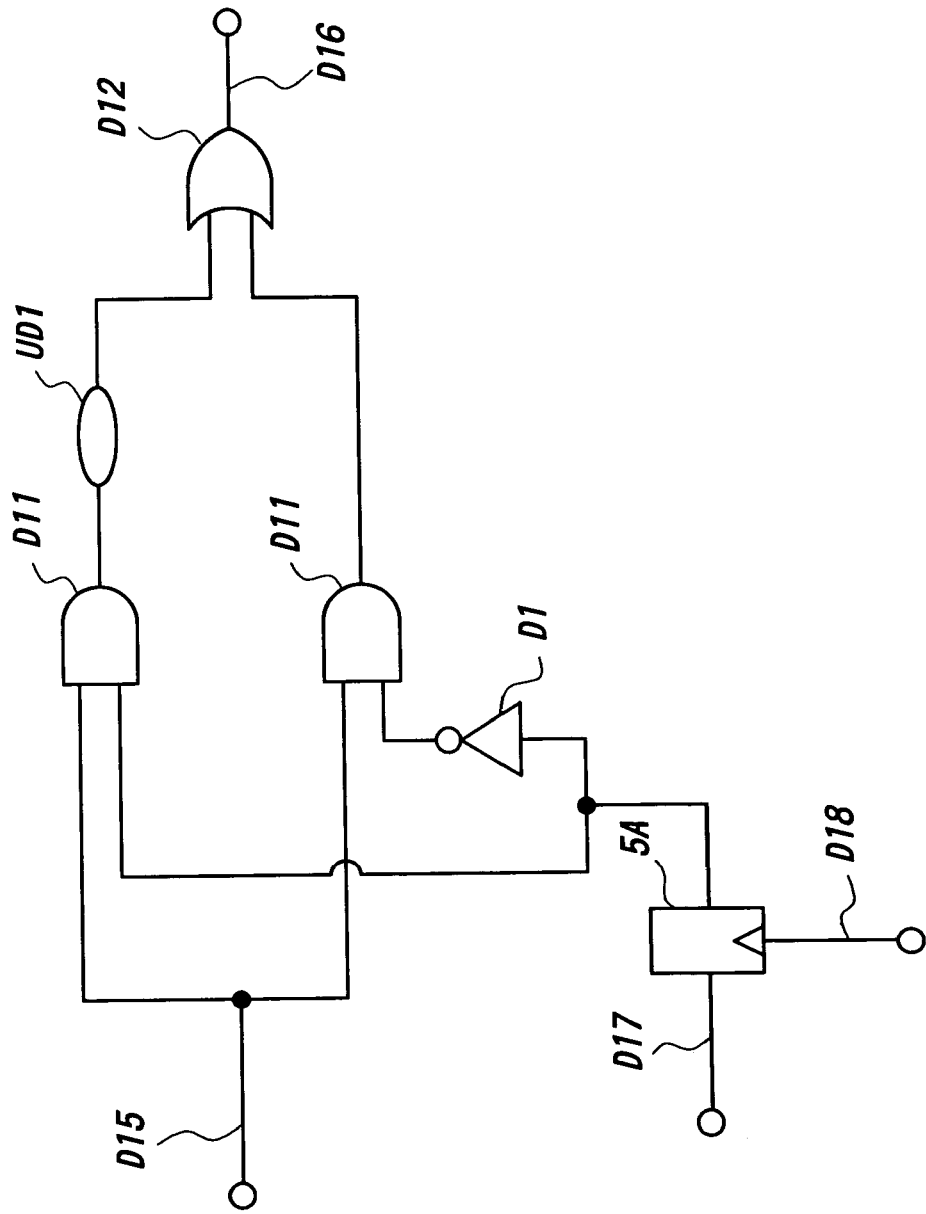
FIG. 10 is a circuit diagram showing an example of a composition containing an adjustable delay element and the lowest bit of a register in the embodiment.

FIG. 10 shows a composition example including an adjustable delay element 4 and the lowest bit 5A of the register 5.

In FIG. 10, symbol D1 is a NOT element, D11 is an AND element, D12 is an OR element, UD1 is a unit delay circuit, 5A is the lowest bit (1 bit portion) of a register 5, and D15 is a clock input from a clock circuit. A clock output D16 is inputted to the clock terminal of a flip-flop to be adjusted. D17 is a delay setting value input to the register 5A and D18 is a signal to be written to the register 5A, and a signal obtained by adding up these for all bits of each register 5 and for all the registers is a delay setting signal 93.

A switch in this case is a basic selector circuit using AND elements D11 and the OR element D12, and a delay element UD1 for generating a delay DT is inserted into the output of one AND element D11 and the output of the other AND element D11 skips the delay element UD1 by being connected directly to the OR element D12.

That is to say, when the output of the register 5A is logic value "1", the AND element D11 at the delay element UD1 side works to generate a delay DT, and when the output of the register 5A is logic value "0", the AND element D11 at the side where the delay element UD1 is skipped works to generate no delay.

Figure 11:
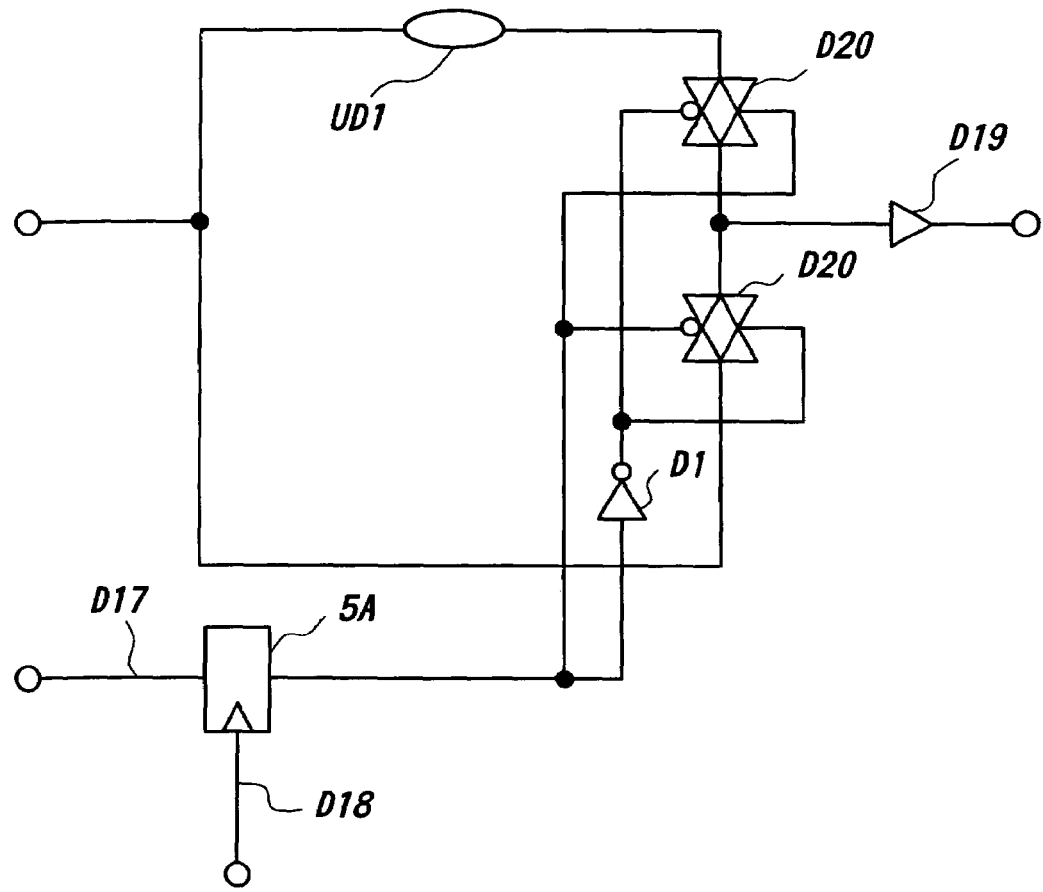
FIG. 11 is a circuit diagram showing another example of a composition containing an adjustable delay element and the lowest bit of a register in the embodiment.

FIG. 11 shows another composition example including an adjustable delay element 4 and one bit A5 portion of a register 5.

This composition example is composed of a transfer gate element D20 and a buffer D19. The function of the transfer gate element D20 is a switch itself, and has the same function as the case where the AND elements and OR element are combined.

Circuits of FIGS. 10 and 11 are implementation examples in relation to the lowest bit, and an implementation example in relation to the second bit, third bit or the fourth bit starting from the lowest bit can be obtained by using UD2, UD3 or UD4 as a unit delay circuit.

It is a matter of course that other digital circuits having the same function as these composition examples can be easily formed and can be used instead in the above-mentioned embodiment.

A digital system internal state signal 12 is composed of the outputs of all or some of flip-flops 2 to be adjusted and flip-flops 3 not to be adjusted in a digital system 1 and is inputted into a digital signal observing device 7.

In order to input a digital system internal state signal 12 into the digital signal observing device 7, it is enough for example to prepare the outputs of those flip-flops as the output terminals of the digital system 1 and connect them to the digital signal observing device 7.

In case that the number of bits of a digital system internal state signal 12 is large, a method of dividing the outputs of the above-mentioned flip-flops into a plurality of groups and inputting them into a selector circuit, and applying repeatedly the same test signal 10 as changing over the groups to be outputted from the digital system 1 may be adopted.

Or a method which makes a digital system 1 have a scan pass circuit built in it, stops a test signal 10 and a clock signal 9 in the course of operation, and takes out a digital system internal state of the digital system 1 at that point of time using the scan pass circuit and delivers it to the digital signal observing device 7 may be adopted.

A scan pass circuit in this case is a circuit which implements such an operation mode that operates all or some of flip-flops in a digital system 1 as a single or a plurality of shift registers, and makes it possible to observe an internal state of the digital system 1 being in the course of operation or set its internal state from the outside.

A method for setting a delay value to a register 5 from a delay setting device 6B is described.

A one-bit portion 5A of the register 5 has a setting input signal D17 and a setting (write) specifying signal D18 as shown in FIG. 10, and a delay setting signal 93 is composed of signals of these two kinds for all the registers. The delay setting signal 93 is outputted from the delay setting device 6B and is inputted into the digital system 1.

For example, the delay setting device 6B can be formed using a parallel interface board of a personal computer, and the number of bits corresponding to the bit width of the delay setting signal 93 is provided.

Writing to a register can be implemented by giving a signal of 0 or 1 to a delay setting signal connected to a setting input terminal of a certain bit of a certain register 5 out of the delay setting signal 93 to be outputted as a parallel interface output signal of the delay setting device 6B and giving a signal specifying the setting to a bit connected to a corresponding setting signal.

The value to be written to the register at this time is a value computed by an adjusting algorithm executing device 6A.

Alternatively, all the registers 5 in the digital system 1 can be numbered, and the delay setting signal 93 can be composed of these register numbers, values to be written into the registers and a setting specifying signal.

In this case, the delay setting signal 93 sent from the delay setting device 6B to the digital system 1 is divided and distributed according to their register numbers by means of a multiplexer circuit in the digital system 1, gives a delay setting value to the setting input terminal of a register specified by a register number, and gives a setting specifying signal as the setting specifying signal of a specified register.

A parallel interface board can be used in the same way also in order to connect the delay setting device 6B and the digital system 1 in this case.

Alternatively, a serial signal (signal of 1 bit in width) generated by arranging the set values for all the registers in one line in the delay setting device 6B and performing a parallel-to-serial conversion on them can be used as the delay setting signal 93.

In this case, the delay setting signal 93 is serial-to-parallel converted inside the digital system 1 and its setting values are written into the respective registers. Since the delay setting signal 93 is a signal of 1 bit in width, a serial interface circuit such as RS-232C or the like can be used for connection of the delay setting device 6B and the digital system 1.

Next, the first embodiment of an adjusting method of the present invention for adjusting a digital system 1 of the above-mentioned embodiment is described.

Figure 13:
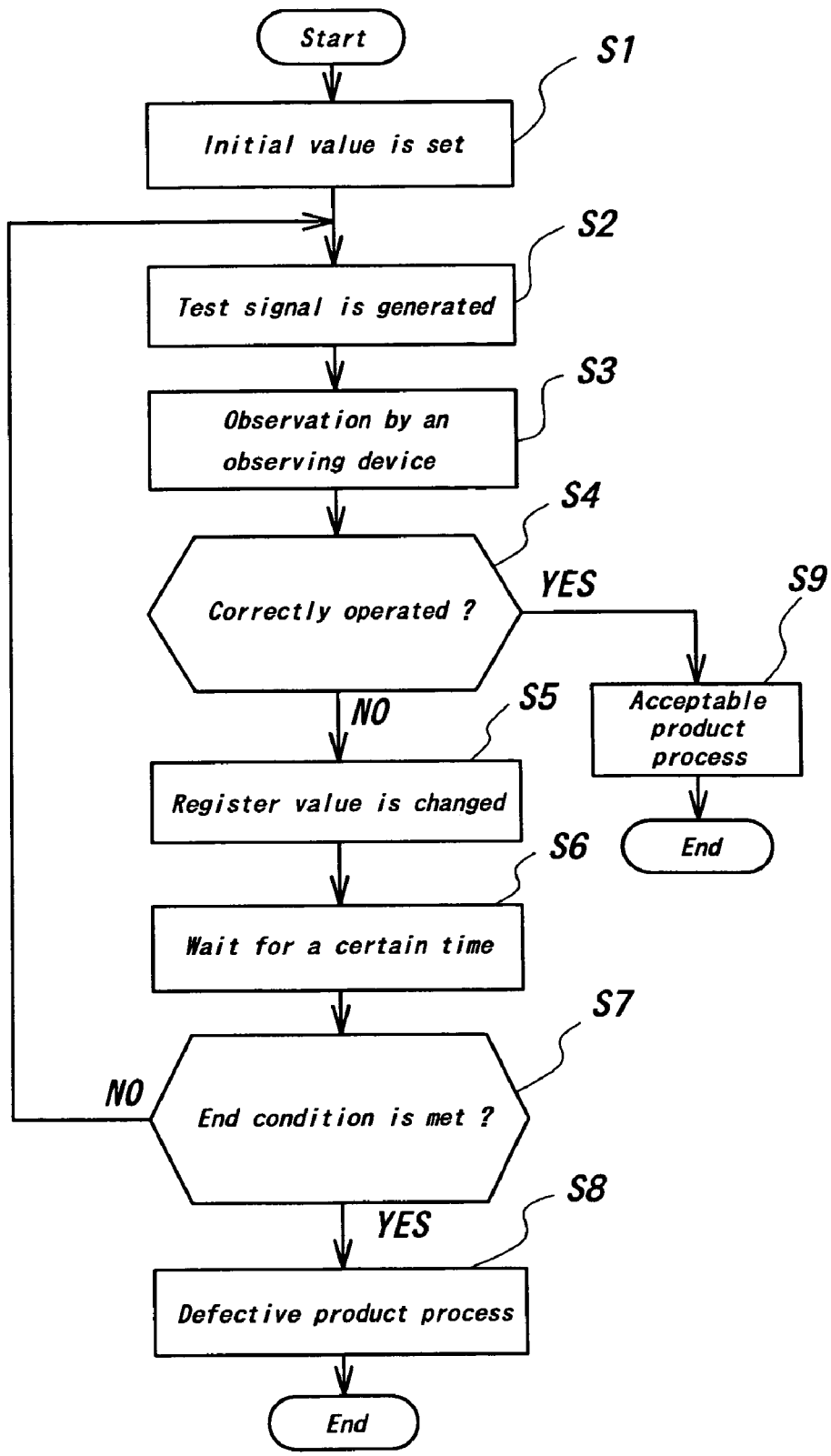
FIG. 13 is a flowchart roughly showing the processing procedure of the first embodiment of a clock signal adjusting method of a digital system of the present invention.

After the digital system 1 has been manufactured, in an adjusting process, as shown in FIG. 1, the adjusting device 6, the digital signal observing device 7 and the digital test signal generating device 8 are connected to the digital system 1, and the digital test signal generating device 8 inputs the digital test signal 10 and the clock signal 9 into the digital system 1 and the adjusting device 6 sets the register value of the register 5 according to a processing procedure shown in FIG. 13.

In this processing procedure, first in step S1 the adjusting device 6 writes a predetermined initial setting value into the register 5 and makes the register hold it as its register value, in the next step S2 the digital test signal generating device 8 outputs a test signal and makes the digital system 1 operate under input of a clock signal 9 having a fixed frequency in response to this test signal, in the next step S3 the digital signal observing device 9 observes the output of the digital system 1 and the internal state of the digital system and sends the observation result to the adjusting device 6, and in the next step S4 the adjusting device 6 judges whether or not the digital system 1 operates correctly, using the sent observation values.

Hereupon, in case that the digital system 1 performs an incorrect operation, a series of processes are repeatedly performed in which the adjusting device 6 changes the register value held by the register 5 in step S5, waits for a fixed time until the change result is stabilized in the next step S6, judges whether or not the end condition has been met in the next step S7, and if the end condition has been met, it performs a defective product process in step S8 and then it ends the process, but if the end condition has not been met this procedure returns to step S2. And in case that it has been judged that the digital system 1 has correctly operated in step S4, this procedure performs an acceptable product process in step S9 and thereafter ends the process.

As a method for changing a register value from the initial set value as described above, several methods can be used and examples of them are described below.

That is to say, a first method is a method of changing over the set values sequentially in a proper order in relation to all combinations within a conceivable range of register values, and a second method is a method of generating at random the set values. And a third method is a method of setting a delay value obtained at design as the initial set value and finely changing the set values from the initial set value in the positive direction and the negative direction.

In case that the number of adjustable delay elements 4 in a digital system 1 to be adjusted is small and no combinatorial explosion of register values occurs, the first and second methods can be used. However, since in this embodiment the number of adjustable delay elements 4 is large and occurrence of a combinatorial explosion is expected in an adjusting and search space, the third method is used. At this time a method called a genetic algorithm is used. A method for adjusting a digital system 1 using a genetic algorithm is described in the following.

As a reference paper for the genetic algorithm, there is for example "Genetic Algorithms in Search, Optimization, and Machine Learning" written by David E. Goldberg, published by ADDISON WESLEY PUBLISHING COMPANY, INC., in 1989. A genetic algorithm called in the present invention means an evolutionary computation technique.

What degree a digital system 1 operates correctly to can be represented by an evaluation function F taking the delay values of all adjustable delay elements as arguments. To correctly operate a digital system 1 is equivalent to obtaining delay values which optimize the evaluation function F. The present inventors pay attention to this point and have found that the genetic algorithm can be applied to adjustment of a digital system 1. An adjusting device 6 changes register values of registers 5 according to this genetic algorithm.

A genetic algorithm first sets a population of virtual creatures having genes, and makes the individuals adapted to a predetermined environment survive and leave their descendants at a high probability according to the degree of their fitness. This makes children inherit the genes of their parents by means of a procedure called a genetic operation. Individuals having high fitness become the majority of a population of creatures by performing such alternation of generations and making genes and a creature population evolve. And as a genetic operation in this case, techniques of gene crossover, mutation and the like which occur also in reproduction of actual creatures are used.

Figure 14:
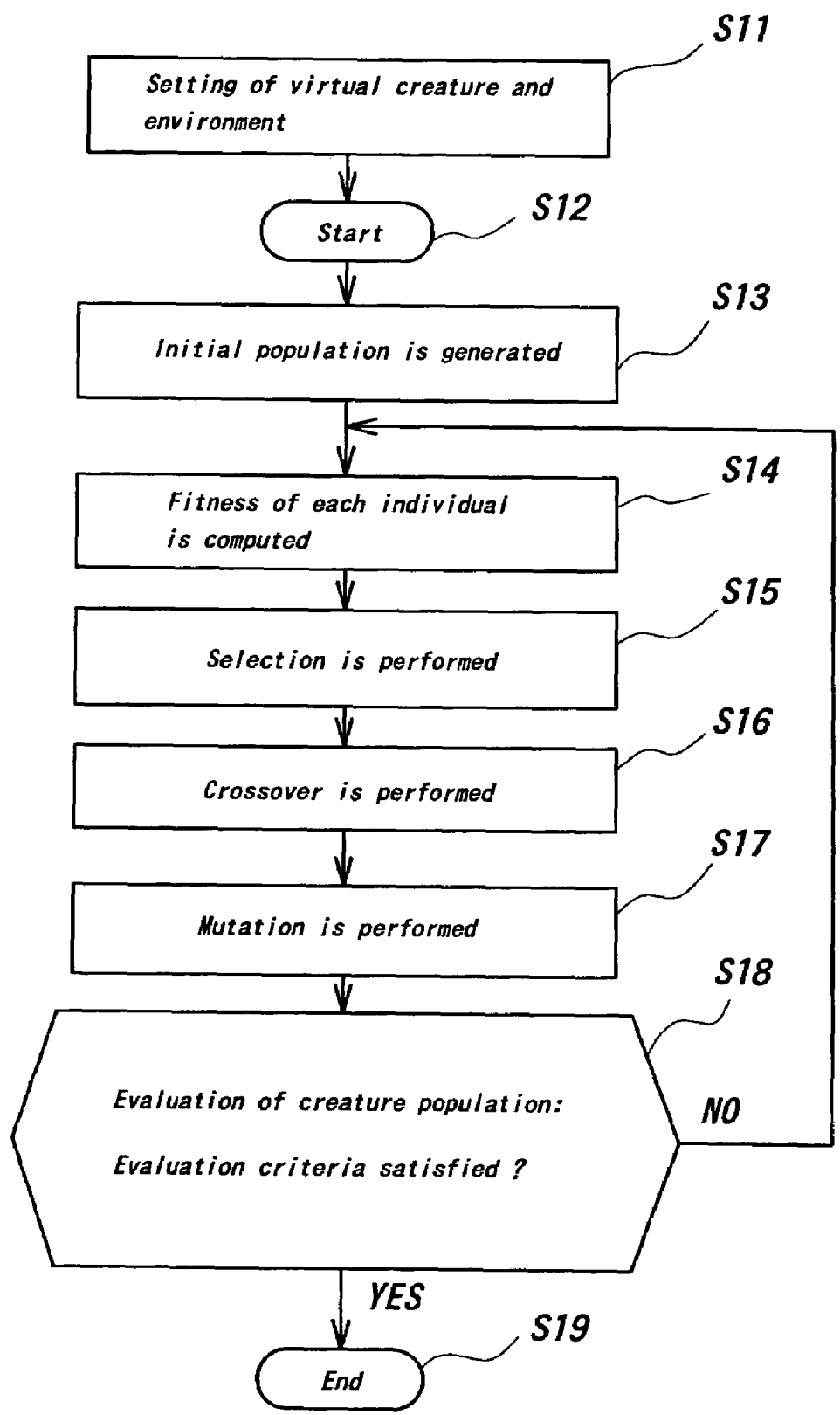
FIG. 14 is a flowchart roughly showing the procedure of a general genetic algorithm.
Figure 15:
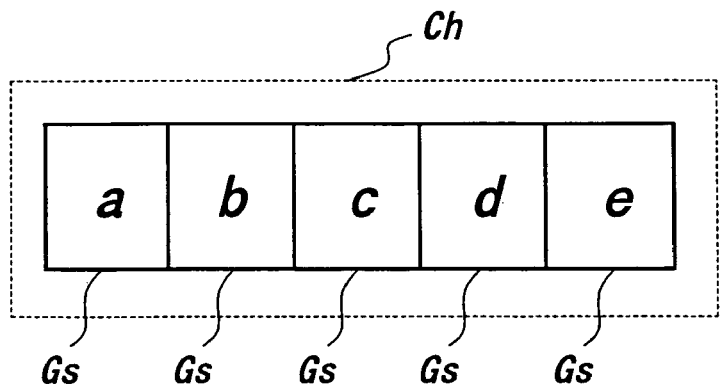
FIG. 15 is an explanatory diagram exemplifying a chromosome used in a genetic algorithm.

FIG. 14 is a flowchart showing a rough procedure of such a genetic algorithm, where first in step S11 the chromosome of an individual is determined. That is to say, in what form what content of data is to be transmitted from parent individuals to their child individuals in alternation of generations is determined. FIG. 15 illustrates a chromosome. Here, a variable vector x of an optimization problem to be handled is represented by a sequence of M symbols Ai (i=1, 2, . . . , M), and this is considered as a chromosome composed of M loci. Each symbol Ai is a gene and a value which it can take is an allele. In FIG. 15, Ch represents a chromosome and Gs represents a locus, and the number of loci M is five. As alleles, a certain set of integers, real number values in a certain range, a simple sequence of symbols and the like are determined according to problems. In the example of FIG. 15, alphabetic characters of a to e represent alleles. A set of genes symbolized in such a way is a chromosome of an individual.

In step S11, a method for computing the fitness representing what degree each individual is adapted to an environment to is determined. At this time the design is performed so that the higher or the lower variable the value of an evaluation function of the optimization problem to be handled is, the higher the fitness of an individual corresponding to it is. And in alternation of generations performed after this, the higher an individual is in fitness, the higher the probability that this individual survives or generates its descendant is made than another individual being lower in fitness. Contrarily, an individual being lower in fitness is considered to be an individual being not well adapted to the environment and is eliminated. This reflects the principle of natural selection in the theory of evolution. Namely, fitness is a measure representing a degree of superiority of an individual is excellent to from a viewpoint of the possibility of survival.

In a genetic algorithm, at the beginning of search, the problem to be handled is generally a perfect black box and what individual is desirable is not definite at all. Therefore, usually the initial creature population is generated at random using random numbers. In a procedure in this case also, therefore, in step S13 after the process has been started in step S12, the initial creature population is generated at random using random numbers. When there is some previous knowledge of a search space, such a process that generates a creature population around a portion whose evaluation value is considered to be high is sometimes performed. In this case the total number of individuals to be generated is called a population size.

Next, in step S14 the fitness of each individual in a creature population is computed on the basis of the computing method previously determined in step S11. After the fitness of each individual has been obtained, in the next step S15 individuals to be the base for individuals in the next generation are selected from the population. If only the selection is performed, however, the percentage of individuals having the highest fitness at the current point of time in the creature population becomes simply higher and no new searching points are generated. For this reason, operations called crossover and mutation to be described below are performed.

Namely, in the next step S16, a pair of two individuals is selected at random at a specified frequency of occurrence out of individuals of the next generation generated by selection and their chromosomes are recombined and thereby their child chromosomes are made (crossover). Hereupon, the probability of occurrence of crossover is called a crossover rate. A descendant individual generated by crossover is an individual which has inherited characters from the respective individuals being its parents. By this crossover process, the diversity of chromosomes of individuals is made high and evolution occurs.

After the crossover process, in the next step S17 genes of individuals are changed in a certain probability (mutation). Here, the probability of occurrence of mutation is called a mutation rate. The phenomenon that the content of a gene is rewritten is observed also in genes of an actual creature. However, if the mutation rate is made too large, genetic features of characters of the parents to be inherited by crossover are lost and the search comes to be similar to searching at random in a search space, and therefore some attention is needed.

A population of the next generation is determined by the above-mentioned process, and next, in step S18 it is examined whether or not the generated creature population of the next generation meets criteria for ending the search. These evaluation criteria typically include the following items, depending on problems to be solved.

The highest fitness in a creature population has become larger than a certain threshold value.

The average fitness in the whole creature population has become larger than a certain threshold value.

Generations each having the increasing rate of fitness of its creature population which increasing rate is not larger than a certain threshold value have been appeared in succession at least for a fixed period.

The number of alternations of generations has reached a predetermined number.

When any of the above-mentioned end conditions (evaluation criteria) has been satisfied, the procedure proceeds to step S19 to end the search and takes an individual having the highest fitness in the creature population at this point of time as a desired solution for the optimization problem. When the end conditions are not satisfied the procedure returns to the process for computing the fitness of each individual in step S14 and continues the search. By such repetition of alternation of generations it is possible to improve the fitness of each individual while keeping constant the number of individuals in a creature population. The above is an outline of a genetic algorithm.

Figure 16:
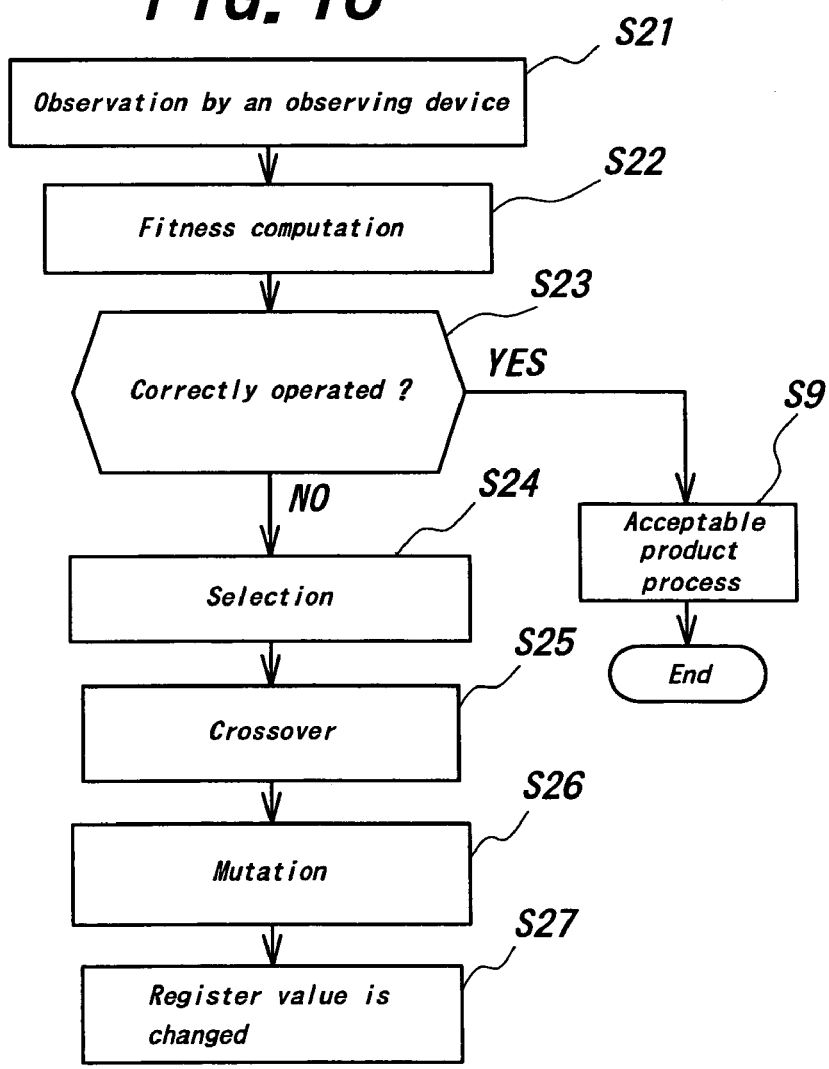
FIG. 16 is a flowchart showing the processing procedure of an adjusting device using a genetic algorithm in the method of the embodiment.

The framework of a genetic algorithm as described above is so loose that details of an actual programming are not prescribed, and the framework does not prescribe a detailed algorithm for an individual problem. Therefore, in order to use a genetic algorithm in adjustment of a digital system of this embodiment, it is necessary to implement the following items for adjustment of the digital system.
(a) Method for representing a chromosome
(b) Evaluation function for individuals
(c) Selection method
(d) Crossover method
(e) Mutation method
(f) End conditions for the search FIG. 16 is a flowchart showing a processing procedure of an adjusting device 6 using a genetic algorithm in this embodiment. A process of FIG. 16 shows concretely a process from step S3 to step S5 of FIG. 13. This embodiment is greatly characterized by directly using the register values of registers 5 as a chromosome in the genetic algorithm, and thereby can dispense with a process and the like for converting information of a chromosome into register values. Namely, a chromosome in this embodiment is composed of the register values of a plurality of registers 5, as shown in FIG. 17.

Figure 17:
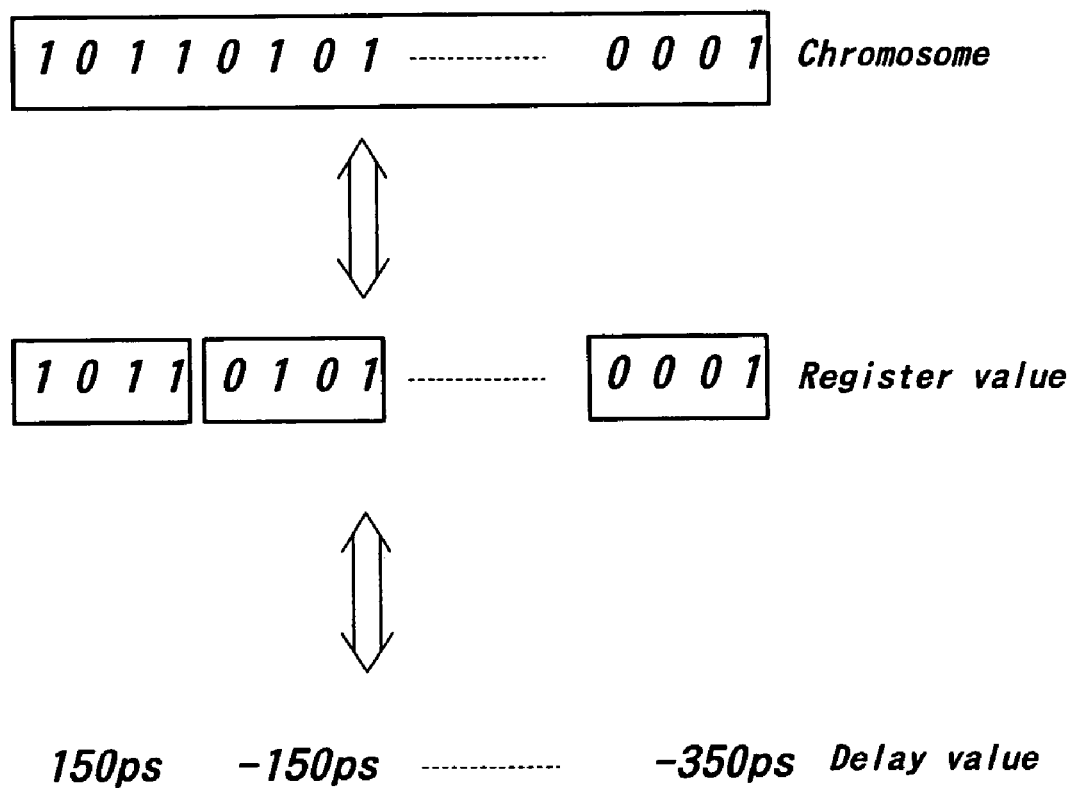
FIG. 17 is an explanatory diagram showing a chromosome used in a genetic algorithm in the method of the embodiment and register values and delay values determined from the chromosome.

In FIG. 17, a delay value being positive in sign (having no sign) delays a signal by its delay time and a delay value being negative in sign advances a signal by its delay time, and the unit ps of a delay value means a picosecond.

This embodiment uses, as an evaluation function F for individuals in the generic algorithm, a function representing how close a characteristic obtained by a digital signal observing device 9 is to an ideal characteristic, as a result of operating a digital system 1 by using the register values represented by the chromosome of an individual.

A plurality of individuals are made in advance using uniform random numbers as the initial population for the genetic algorithm in step 1 of FIG. 13 for use in the process shown in FIG. 16. Namely, this case means that the value of each gene of each chromosome in the initial population takes a value of 1 in a probability of 0.5 and takes a value of 0 in a probability of 0.5. In case that there is some previous knowledge of the tendency of non-uniformity in clock timing, however, it is possible to make individuals being considered to be higher in fitness as the initial population.

From an observation value sent from the digital signal observing device 7, the adjusting device 6 computes a fitness by means of the evaluation function. After this, it judges whether or not the digital system 1 correctly operates in performance in step S23, and in case that the digital system 1 operates incorrectly, the procedure performs selection in step S24, crossover in step 25, mutation in step S26 and a process of step S27 and thereby generates a population of individuals of the next generation (a candidate population for solution).

Thus, when it has been judged that the digital system 1 operates correctly in performance in step S23, an acceptable product process is performed and then the adjusting process is ended, but in case that a chromosome (register values) which correctly operates cannot be obtained even if repeating the adjusting process for a certain number of generations, the digital system 1 to be adjusted is judged as a defective and this procedure performs a defective product process on it in step S8 of FIG. 13.

Figure 18:
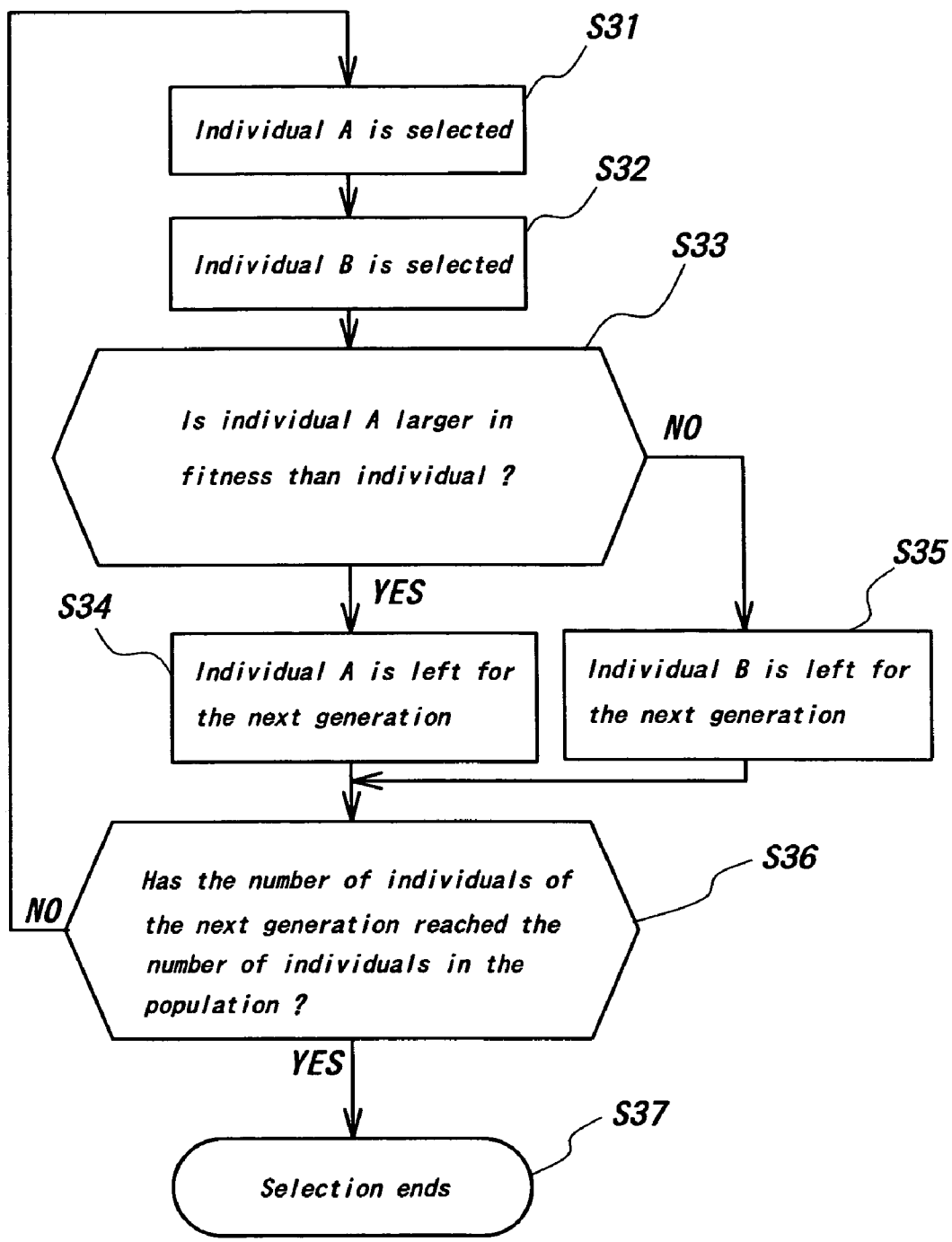
FIG. 18 is a flowchart showing the procedure of a selection process performed by a genetic algorithm in the method of the embodiment.

The selection process of step S24 uses a method shown in a flowchart of FIG. 18. This method first selects two individuals A and B out of a population in steps S31 and S32, and then determines an individual having the larger value of fitness out of the two individuals A and B as an individual to survive in the next generation. Then the method returns from step S36 to step S31 and repeats this operation until the number of individuals which have survived reaches the number of individuals in the population. By this method, the possibility that an individual being high in fitness is selected as an individual of the next generation is high, but since individuals A and B are selected at random, the possibility that even an individual being low in fitness is selected as an individual of the next generation results in being left. The reason for doing in such a way is that if only individuals being high in fitness are left the convergence of a population is made high and sticking to a local optimum solution is liable to lead the adjustment to failure.

Figure 19:
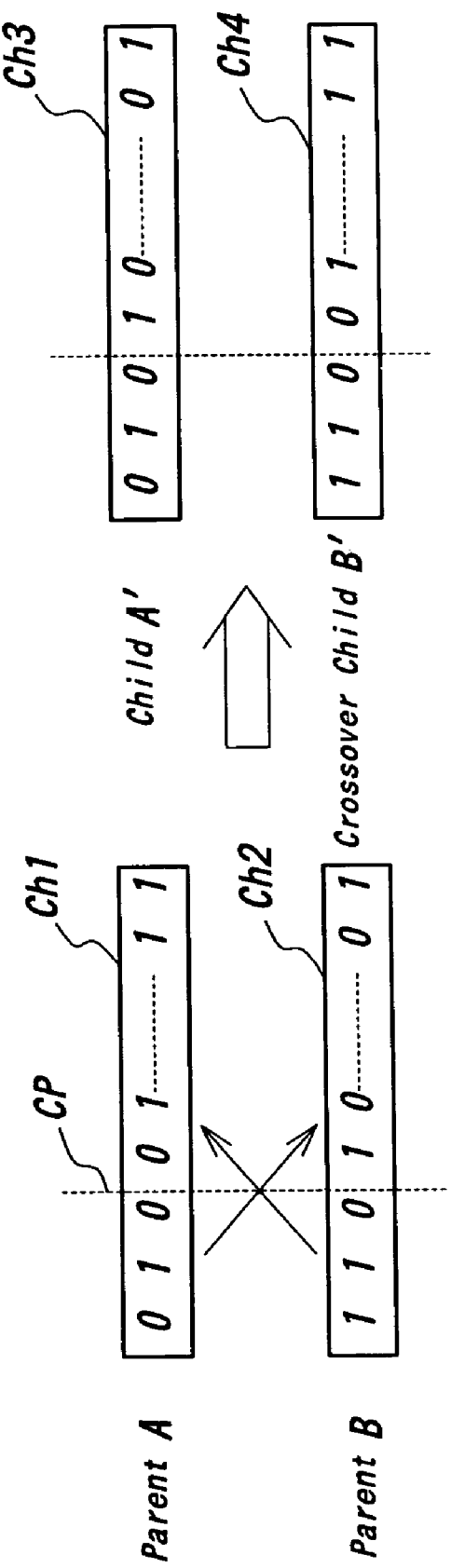
FIG. 19 is an explanatory diagram showing the procedure of a crossover process performed by a genetic algorithm in the method of the embodiment.

In a crossover process of step S25, a method shown in an explanatory diagram of FIG. 19 is used. This is an operation for replacing chromosomes in parts at random positions and is a technique called a one-point crossover. In FIG. 19, Ch1 and Ch2 are chromosomes of parents A and B which have survived as a result of selection, and the crossover process in this case cuts these chromosomes at a crossover position CP selected at random. The example of FIG. 19 selects as a crossover position the position between the third gene and the fourth gene from the left. Here, it generates child A' and child B' respectively having chromosomes Ch3 and Ch4 by replacing the cut partial gene patterns with each other and replaces the original individuals A and B with these children A' and B'.

Figure 20:
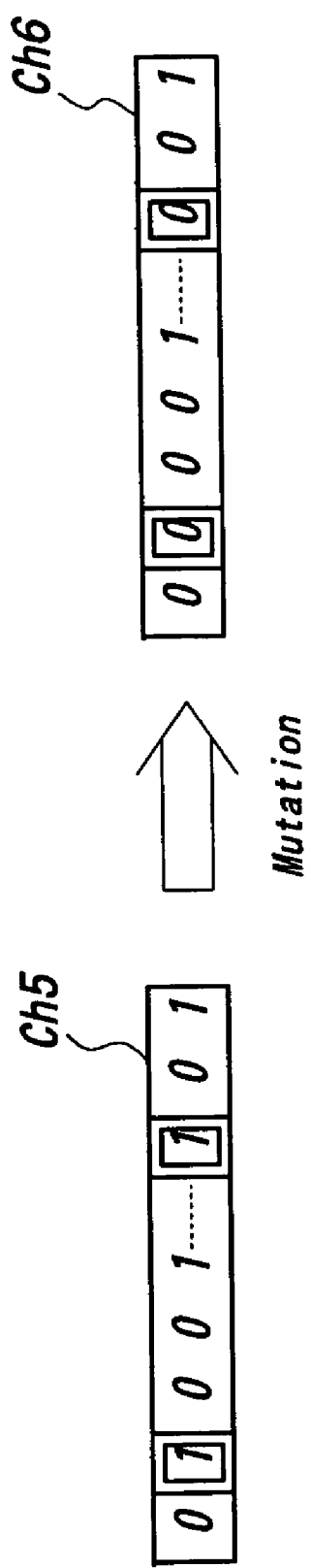
FIG. 20 is an explanatory diagram showing the procedure of a mutation process performed by a genetic algorithm in the method of the embodiment.

The mutation of step S26 to be performed following the crossover in step S25 is an operation that changes each bit of the genes of each chromosome from 0 to 1 or from 1 to 0 in an occurrence probability of a mutation rate. FIG. 20 shows an example of mutation. In this figure, mutation has occurred on the genes enclosed by tetragons, which are the second bit from the left and the third bit from the right, of chromosome Ch5 and these genes have been changed to the respective alleles in chromosome Ch6.

As described above, in a digital system 1 of this embodiment, delay elements 4 being variable in delay value are inserted into a clock circuit for a plurality of flip-flop elements in the digital system 1, and the delay values of these delay elements 4 are searched so that the digital system 1 correctly operates. Accordingly, it is possible to adjust a digital system 1 so as to correctly operate by absorbing non-uniformity in quality of clock circuits in a digital system manufacturing process and errors in clock timing caused by errors and the like in design, and this means that a digital system being larger in scale and higher in speed than that obtained by the prior art can be obtained by a less design effort than that of the prior art.

This embodiment can also use data of a margin time in timing for each flip-flop computed by an LSI CAD system in order to select a flip-flop to be adjusted. That is to say, it selects as flip-flops to be adjusted a specific number of flip-flops being less in margin time, or selects as flip-flops to be adjusted flip-flops being on and around the critical path to determine the upper limit of an operating frequency of the digital system.

Additionally, the following adjusting method can be also used in relation to this embodiment.

That is to say, although it is assumed that the frequency of a clock signal 9 is a constant value in the above-mentioned adjusting method, it is possible to perform adjustment so that the operating frequency is made higher by ending this adjustment and then raising the frequency of the clock signal 9 and performing adjustment in a similar manner.

Figure 21:
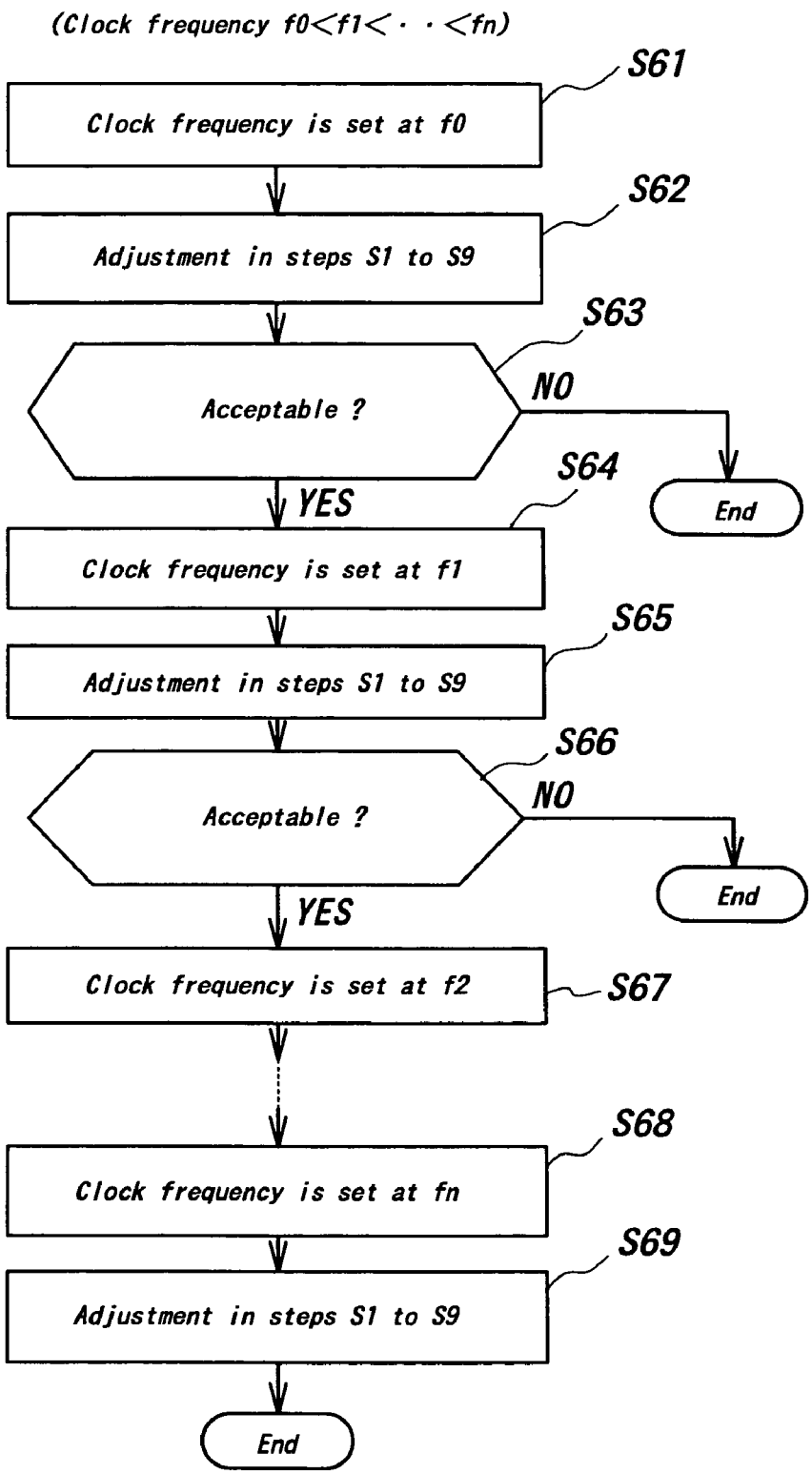
FIG. 21 is a flowchart showing the procedure in case of performing adjustment as raising an operating frequency in stages in the method of the embodiment.

FIG. 21 shows an adjusting method in the above-mentioned case. In this processing procedure, first in step S61, the frequency of a clock signal 9 to be inputted into a digital system 1 is set at f0 and then in step S62 an adjusting device 6 performs adjustment from step S1 to step S9 shown in FIG. 13. In the next step S63, it judges whether or not the digital system 1 has been adjusted to be an acceptable product as a result of adjustment in step S61. In case that it has not been made acceptable as a result of adjustment the process is ended. In case that it has been made acceptable as a result of adjustment the clock frequency 9 is set at a value f1 larger than f0 in step S64. Thereafter, the digital system 1 is adjusted in step S65 similarly to step S62. In step S66 it performs judgement in the same way as step S63, and in case that the system is acceptable it is repeated to set the frequency at a still larger value and adjust the system. In case of setting the clock frequency at the upper limit value fn in step S68 as the result of repetition, adjustment is performed in step S69 and the process is ended.

The clock frequency f0 is determined by a design value of the operating frequency of the digital system 1 and the frequency fn is determined by the upper limit of an allowable input clock frequency. A value of n and values of f1 to fn−1 are determined according to a necessary adjustment accuracy. It is possible to raise the upper limit value of an operating frequency of the digital system 1 according to variation in clock timing by means of this adjusting method.

In the case of setting f0 lower than a design value of the operating frequency and performing adjustment as gradually raising the clock frequency fi (i=1, . . . , n), the adjustment takes a long time but there is an advantage of securely performing adjustment.

Further, according to the adjusting method, it is possible to improve the stability of a digital system by operating the digital system, which has been judged to be acceptable at an operating frequency of fj, at a frequency of fi (i<j) at the time of using the system. The reason is that since the system has been adjusted in clock timing so as to operate at a higher frequency than a frequency in use of the system, even in case that a slight change in clock timing is caused by the influence of temperature of the system or an external electromagnetic noise, an erroneous operation does not easily occur.

This adjusting method can be also used in a mass production process of a digital system 1. A conventional mass production process has generally performed only an operation test without performing adjustment and has performed selection according to the upper limit of an operating frequency determined by the degree of variation of each system. According to the adjusting method, however, since it is possible to individually adjust manufactured digital systems and thereby raise the operating frequency of them, it is possible to raise the percentage of digital systems operating at a high frequency. Thanks to this, since a digital system operating at a high frequency is sold at a high price, it is possible to improve the production efficiency.

Next, the first embodiment of the present invention has a variation example as described below. In the previous embodiment, an adjusting device 6, a digital signal observing device 7 and a digital test signal generating device 8 are detachably connected with a digital system 1 as external devices. In the present invention, however, circuits equivalent to the external devices may be incorporated into a digital system 1 as an adjusting means.

Figure 22:
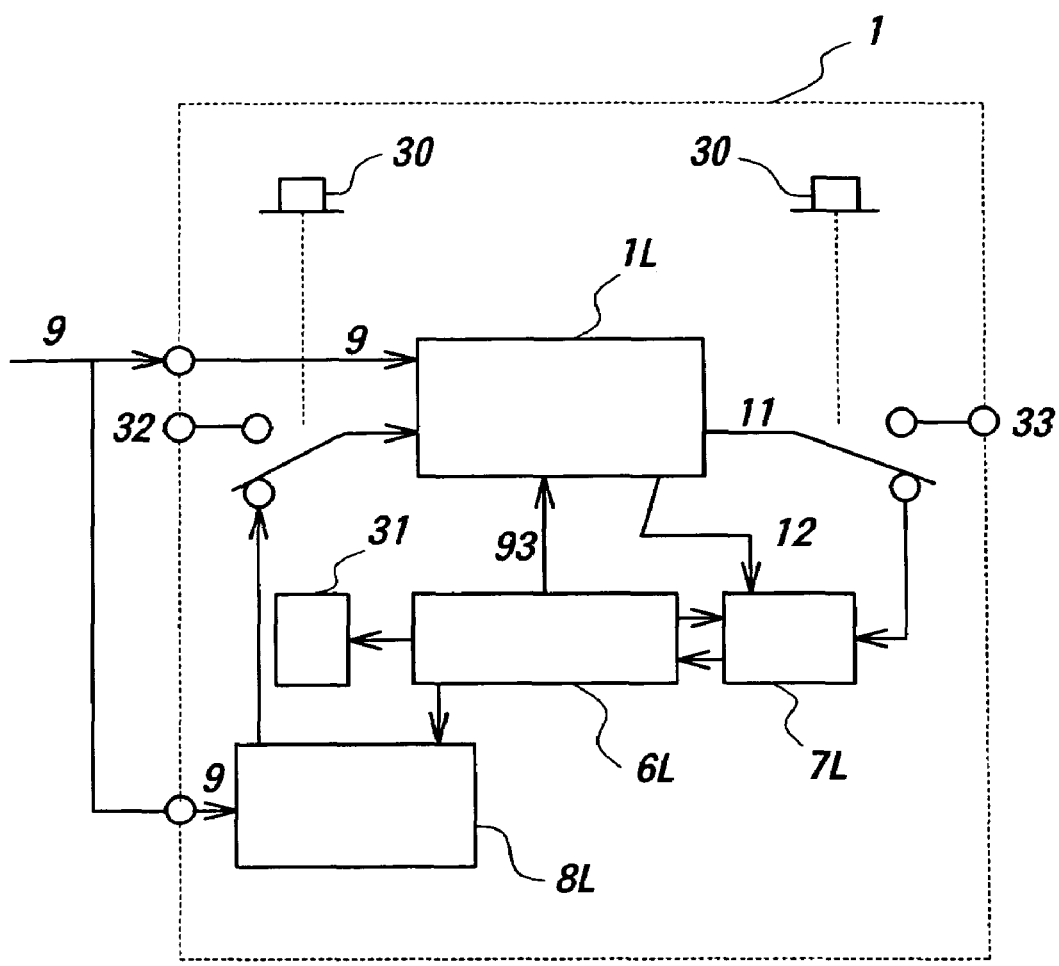
FIG. 22 is a composition diagram schematically showing a variation example of the embodiment.

A variation example composed in such a way is shown in FIG. 22. Here, circuits equivalent to the external devices are incorporated in a digital system 1 in addition to a digital system main body 1L. Changeover switches 30 are provided respectively between the input terminal, output terminal of the digital system 1L and the external input terminal 32, external output terminal 33 of the digital system 1L. These changeover switches 30 may be provided inside the digital system 1L as shown in the example, and may be also provided outside the digital system 1.

Hereupon, when the changeover switches 30 are operated, output of the digital system main body 1L is inputted into a digital signal observing circuit 7L, and an adjusting circuit 6L, the digital signal observing circuit 7L and a digital test signal generating circuit 8L start to operate and adjust the values of registers. When the adjustment has been ended, output of the digital system main body 1L is changed over to the output terminal 33 side by operation of the changeover switches 30. This example is provided with a light emitting device 31 for performing a warning indication in case of being unable to obtain register values necessary for the digital system main body 1L to correctly operate.

According to such a variation example, it is possible not only to adjust a digital system 1 in a manufacturing process but also for a user to purchase a product having a digital system 1 incorporated in it and then adjust the digital system 1 by itself on occasion. Additionally, a digital system 1 is manufactured and then the digital system 1 can be further adjusted by a person adopting adjustment as a profession. Additionally, in a case that an environment where a digital system 1L is installed changes in temperature or the like and the digital system main body 1L varies in clock timing inside it, there is an advantage of being able to compensate for the variation and reduce the probability of incorrect operation of the digital system main body 1L. The changeover switches 30 can be composed so as to be not only manually but also automatically changed over when turning power on. And for the clock signal 9, in a case that a clock circuit is provided in a digital system 1, the clock signal of this clock circuit may be used.

Next, a second embodiment of the present invention is described. This embodiment is a composition example in case of applying a method of the present invention to a memory test pattern generator circuit.

Figure 27:
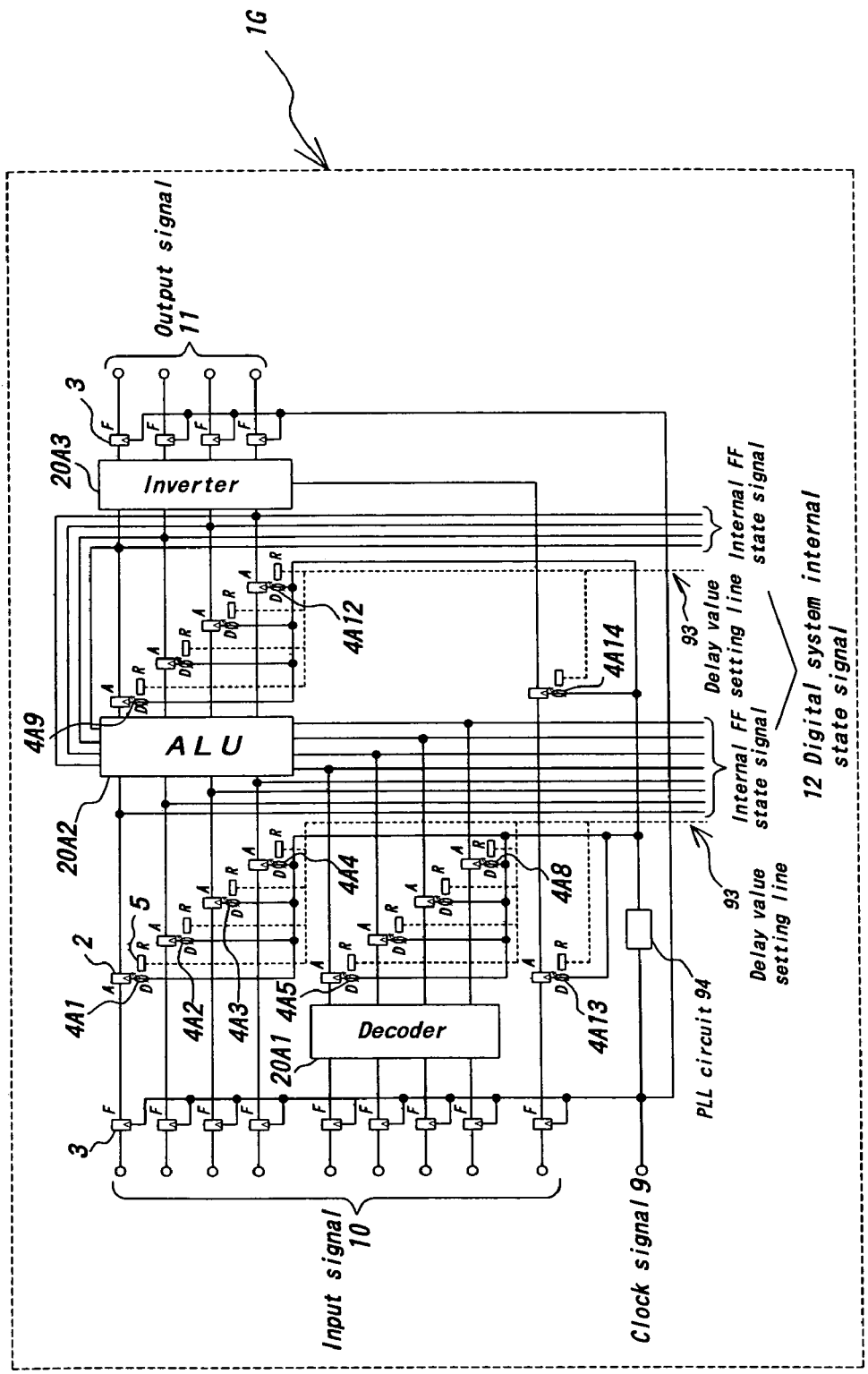
FIG. 27 is a composition diagram schematically showing a memory test pattern generator circuit as a second embodiment of a digital system of the present invention.

FIG. 27 is a composition diagram showing a memory test pattern generator circuit 1G as a second embodiment of a digital system of the present invention having a memory test pattern generating function as its basic function, and corresponds to the digital system 1 portion of FIG. 1 and the same devices as those of FIG. 1 are used as devices other than this.

Here, an adjusting device 6, a digital signal observing device 7 and a digital test signal generating device 8 are external devices. The same circuits as those shown in FIG. 1 are given the same symbols as those.

A flip-flop 2 to be adjusted is an ordinary D flip-flop, and a flip-flop 3 not to be adjusted is also an ordinary D flip-flop in the same way. The clock terminal of a flip-flop 3 not to be adjusted is connected directly to a clock circuit, but an adjustable delay element 4 is inserted between the clock terminal of a flip-flop 2 to be adjusted and the clock circuit.

A register 5 for controlling the delay time of an adjustable delay element 4 is connected to the delay element 4.

Hereupon, assuming that a register 5 has 4 bits, an adjustable delay element 4 can be composed as shown in FIG. 26.

Furthermore, assuming that the minimum unit DT of a delay time is 50 ps, an adjustable delay element 4 can generate a delay time of 0 ps to 750 ps according to the value of a register 5.

A register 5 can be composed of four ordinary D flip-flops in case that the register 5 has a 4-bit width. Delay value setting signals for 4 bits and a setting instruction signal common to the 4 bits are inputted into the register 5.

A delay setting signal 93 is a signal obtained by collecting the delay value setting signals for 4 bits of each register 5 and each common setting signal in relation to all the registers. And a digital system internal state signal 12 is a signal obtained by collecting all of the outputs of flip-flops 2 to be adjusted.

A decoder circuit 20A1 is a circuit for applying a decoding process to an inputted signal and is composed as a combination circuit (not including a memory element such as a flip-flop and the like).

An ALU circuit 20A2 is a combination circuit which has input signals each being of 4 bits of two systems and an operation specifying signal of 4 bits inputted into it and which performs computation according to the operation specifying signal between the two different sets of the input signals and outputs the computation result as output data of 4 bits.

An inverter circuit 20A3 has a function of inverting or not inverting an input signal and outputting the resulting signal according to specification from the outside, and is composed as a combination circuit.

A PLL circuit 94 is connected between the input terminal of a clock signal 9 and the adjustable delay elements 4 connected to flip-flops 2 to be adjusted, and generates a clock signal to be supplied to the flip-flops 2 to be adjusted, the clock signal being the same in frequency and 400 ps fast in timing.

As described above, since an adjustable delay element 4 can generate a delay of 0 ps to 750 ps, by combining both of them it is possible to supply a delay of −400 ps to 350 ps, namely, a clock in a range from a state of being 400 ps fast to a state of being 350 ps slow to each flip-flop 2 to be adjusted.

In this case, therefore, the clock timing of a flip-flop 2 to be adjusted varies also from −400 ps to 350 ps according to the value set into a register 5. For example, in case that "1011" is set into a register 5, the clock timing of a corresponding flip-flop 2 to be adjusted is delayed by 150 ps in comparison with a clock signal 9 supplied from the outside.

The clock terminal of a flip-flop 3 not to be adjusted is directly supplied with a clock signal 9, and the flip-flop 3 not to be adjusted operates in the same timing as the clock signal 9.

The circuit of this embodiment, in which one side input of the ALU circuit 20A2 is fed back through a flip-flop 2 to be adjusted, is not of a simple pipeline structure.

In this embodiment, all flip-flops connected to external terminals of the digital system 1 are flip-flops 3 not to be adjusted and the other flip-flops are flip-flops 2 to be adjusted, but the present invention does not always need the same composition as this.

A method of the present invention is applicable and effective even in case that each element appearing in this embodiment is not always exact in characteristic values.

This embodiment is preferable particularly in case that it is applied to a memory test pattern generator circuit as used in testing of a high-speed memory element.

Furthermore, the circuit adopted in this embodiment has 4 bits as its output, but in case of a memory test pattern generator circuit having a larger number of bits as its output, since the number of adjusting points is increased and a dependent relation in delay time between flip-flops is complicated and thus a combinatorial explosion is liable to occur, the present invention is preferable in particular.

An adjusting method of the second embodiment of the present invention applied to the memory test pattern generator circuit 1G of this embodiment shown in FIG. 27 is described in the following.

The performance of this memory test pattern generator circuit 1G can be represented by an evaluation function F taking as arguments the delay values of a plurality of adjustable delay elements 4A1 to 4A14. Operating correctly the memory test pattern generator circuit 1G is equivalent to obtaining delay values for optimizing the evaluation function F.

Since in this embodiment the number of delay elements 4 to be adjusted is as many as 14 (4A1 to 4A14) and occurrence of a combinatorial explosion is expected, the adjusting device 6 uses the evaluation function F and changes the values of registers 5 according to a genetic algorithm.

Adjustment of delay elements 4 is performed according to flowcharts shown in FIGS. 13 and 16 in the same way as the first embodiment. This embodiment is greatly characterized by directly using the values of registers 5 as a chromosome in the genetic algorithm. Due to this, a process for converting information of a chromosome into register values is unnecessary.

That is to say, a chromosome in this embodiment is composed of the register values of 14 registers 5 corresponding to 14 delay elements, as shown in FIG. 17. And each register 5 corresponding to each element parameter is of 4 bits. Therefore, the register length (=length of a chromosome) is 56 bits. Accordingly, the size of an adjusting and search space of the memory test pattern generator circuit 1G of the embodiment is $2^{56} \approx 10^{17}$ (10 to the 17th power), and it is a matter of course that adjustment by the whole search is impossible.

In the delay element 4 shown in FIG. 26, this embodiment sets the value of DT at 50 ps. This value is determined according to variation in clock timing. For example, when the register value is "1011" in FIG. 17, switch circuits Sw4, Sw2 and Sw1 become on and delay elements UD4, UD2 and UD1 are connected to the clock circuit, and as the result a delay corresponding to the register value "1011" becomes 8×50+2×50+50−400=150 ps.

Similarly, a delay corresponding to the register value "0101" becomes 4×50+50−400=−150 ps, and a delay corresponding to the register value "0001" becomes −350 ps.

This embodiment uses, as an evaluation function F for individuals in the generic algorithm, a function representing how close a characteristic obtained by a digital signal observing device 9 is to an ideal characteristic, as a result of operating a digital system 1G by using the register values represented by the chromosome of an individual.

$$\text{Fitness} = F = NC/NT \qquad \text{[Formula 1]}$$

Here, NT is the total number of bits of a digital output signal 11 and a digital system internal state signal 12 of the memory test pattern generator circuit 1G in relation to a series of digital test signals 10, and NC is the total number of bits of correct digital values out of a series of digital output signals 11 and a series of digital system internal state signals 12 of the memory test pattern generator circuit. The evaluation function F can adopt a real number value from 0 to 1 and when it takes a value of 1, the memory test pattern generator circuit 1G to be adjusted results in correctly operating. For example, assuming that NC is 253 and NT is 500 in a series of outputs of a digital system 1 set by means of the register values represented by a chromosome, the value of the evaluation function F in this case becomes 0.506.

A plurality of individuals are made in advance using uniform random numbers as the initial population in a genetic algorithm in step S1 of FIG. 13 for use in the process shown in FIG. 14. Namely, this case means that the value of each gene of each chromosome in the initial population takes a value of 1 in a probability of 0.5 and takes a value of 0 in a probability of 0.5. In this embodiment, the number of individuals in a population is set at 50.

After this, the memory test pattern generator circuit 1G is operated by means of the register values represented by each individual, and in step S4 the adjusting device 6 computes a degree of fitness by means of the evaluation function using the result of observation by the observing device 5 in step S3. Thereafter, in order, this method performs a selection process in step S24, a crossover process in step S25 and a mutation process in step S26, and thereby generates a population of individuals of the next generation (a candidate population for solution). In this embodiment, the crossover rate which is the ratio of the number of individuals to be crossed to the total number of individuals is set at 0.5 and the mutation rate is set at 0.0125.

In step S4, it is judged whether or not the memory test pattern generator circuit 1G correctly operates, and when it has correctly operated an acceptable product process is performed and the adjusting process is ended. And in case that a chromosome (register values) correctly operating cannot be obtained even by repeating an adjusting process for a certain number of generations, the memory test pattern generator circuit 1G is judged as a defective and in step S8 a defective product process is performed. In this embodiment, the number of generations to stop the repetition is set at 20.

A result of an experiment in case of applying an adjusting method using a genetic algorithm of this embodiment to the memory test pattern generator circuit 1G shown in FIG. 27 is described in the following. In this experiment, the circuit was made of an LSI chip of cell base using a bipolar technology.

Figure 28:
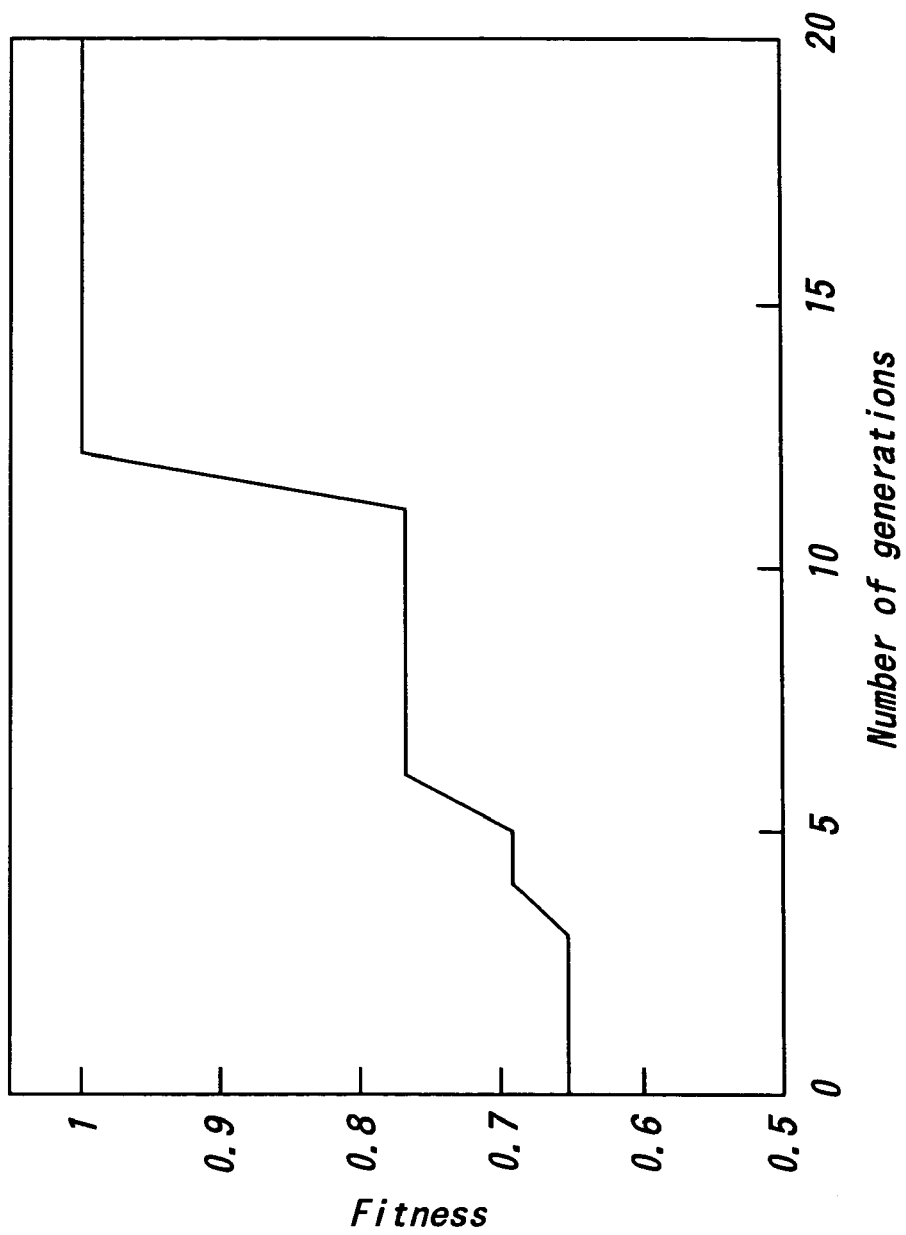
FIG. 28 is a graph showing the relation between fitness and the number of generations under experiment in the embodiment.

As a result of the above-mentioned experiment, an LSI chip which operated incorrectly at a clock frequency of 800 MHz without adjustment could correctly operate after it was adjusted by a method using a genetic algorithm. FIG. 28 shows the relation between the fitness (the average of 10 trials) which is the value of an evaluation function F for the best individual in a generation under experiment and the number of generations. It can be seen that with the advance of generations in the genetic algorithm the value of fitness rises and the timing is adjusted. The effectiveness of the adjusting method of this embodiment has been confirmed by this experiment.

In this embodiment, a memory test pattern generator circuit was implemented on an integrated circuit of cell base, but it can be also implemented on a recomposable integrated circuit such as FPGA, CPLD and the like. In this case, delay adjusting elements may be implemented as a part of an ordinary logic circuit, and delay adjusting elements may be also implemented by developing an FPGA or a CPLD having the delay adjusting elements built in it.

As described above, in the memory test pattern generator circuit 1G of this embodiment, the delay elements 4A1 to 4A14 are inserted in a clock circuit for flip-flop elements, and the delay times of these delay elements 4 are searched so that the memory test pattern generator circuit 1G correctly operates. Therefore, it is possible to absorb errors in clock timing caused by non-uniformity in quality of clock circuits in an integrated circuit manufacturing process, errors in design and the like, and adjust a memory test pattern generator circuit 1G so as to correctly operate, and this means that it is possible to obtain a more high-speed digital system than the prior art in a less design effort than the prior art.

A variation example as described below can be implemented in relation to this embodiment.

When adjusting a memory test pattern generator circuit 1G, it is possible to observe also the current consumption and the temperature of the memory test pattern generator circuit 1G in addition to the output of a digital signal observing device 7 and incorporate them into an evaluation function (fitness). Since the temperature and the current consumption of an LSI vary generally according to clock timing inputted to flip-flops inside the LSI, it is possible to cope with various requirements and improve the accuracy of adjustment by doing in such a way.

Figure 29:
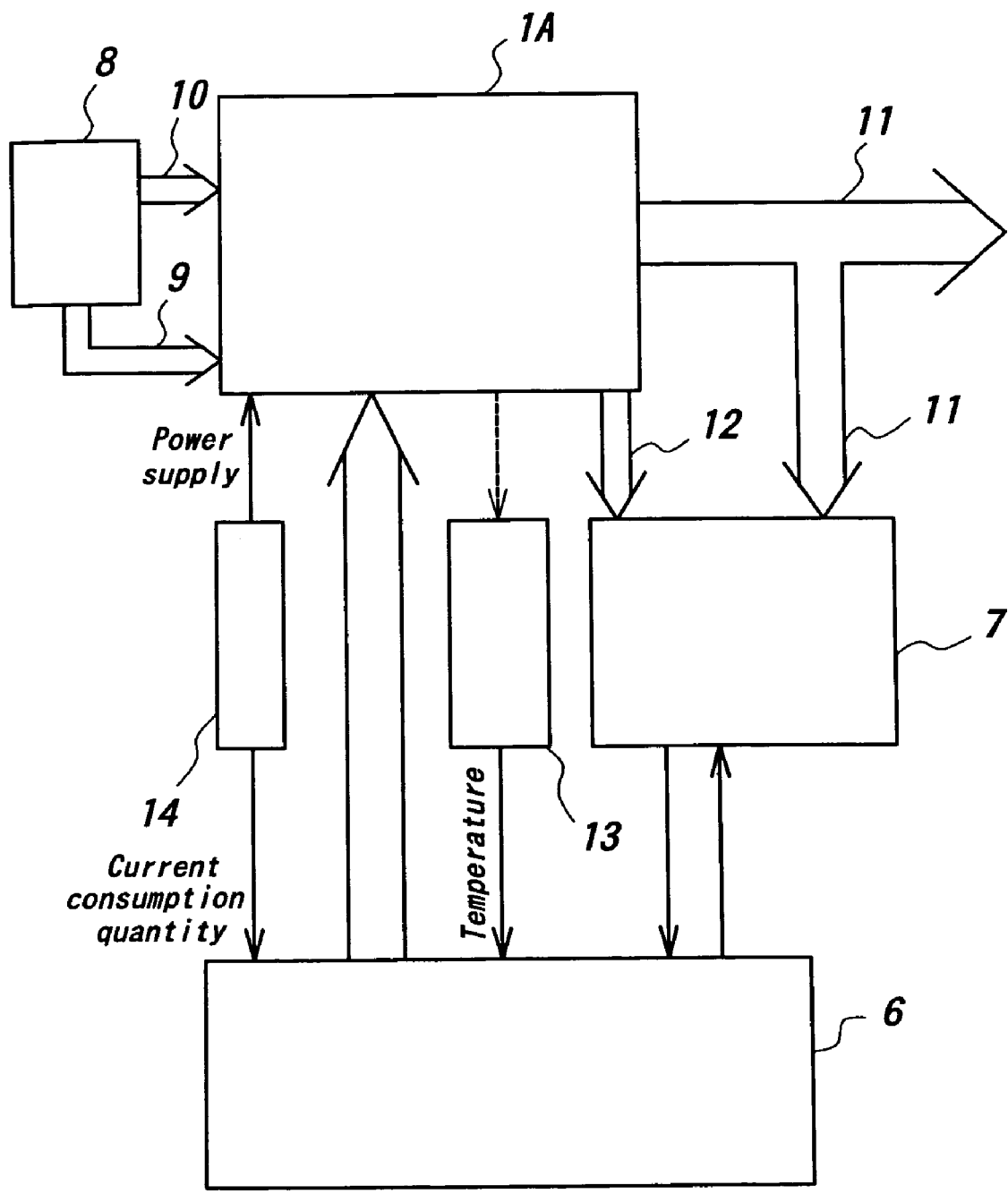
FIG. 29 is a composition diagram schematically showing a variation example of the embodiment.

FIG. 29 shows a composition example in the case. In FIG. 29, symbol 13 is a thermometer and 14 is a power source. In FIG. 29, the same components as those of FIG. 1 are given the same symbols as those. Hereupon, the thermometer 13 measures the temperature of an LSI of a memory test pattern generator circuit 1G and A/D-converts and transmits the value of it to an adjusting device 6.

The power source 14, which is a device for supplying power to the memory test pattern generator circuit 1G, A/D-converts and transmits the value of supplied current to the adjusting device 6. While a digital test signal generating device 8 is outputting a test signal 10, the adjusting device 6 monitors the temperature and the current consumption and computes the average temperature and the average current consumption during this period.

This variation example can use an evaluation function as described below, for example.

$$\text{Fitness} = NC/NT \quad (\text{where } NC/NT < 1)$$

$$\text{Fitness} = 1 + 1/(1.0 + w1|T - Tm| + w2|I - Im|) \quad (\text{where } NC/NT = 1) \quad [\text{Formula 2}]$$

Here, fitness is the fitness in a genetic algorithm, T is a measured average temperature, I is a measured average current consumption, Tm is an ideal average temperature, Im is an ideal average current consumption, and w1 and w2 are weighting factors. This evaluation function adjusts the memory test pattern generator circuit 1G until it comes to perform no erroneous operation, and after it has come to perform no erroneous operation, this evaluation function further performs adjustment so as to bring the average current consumption and the average temperature close to their ideal values.

In this invention, in order to further improve the accuracy of adjustment, the peak value during observation of the current consumption may be incorporated into the evaluation function.

Figure 30:
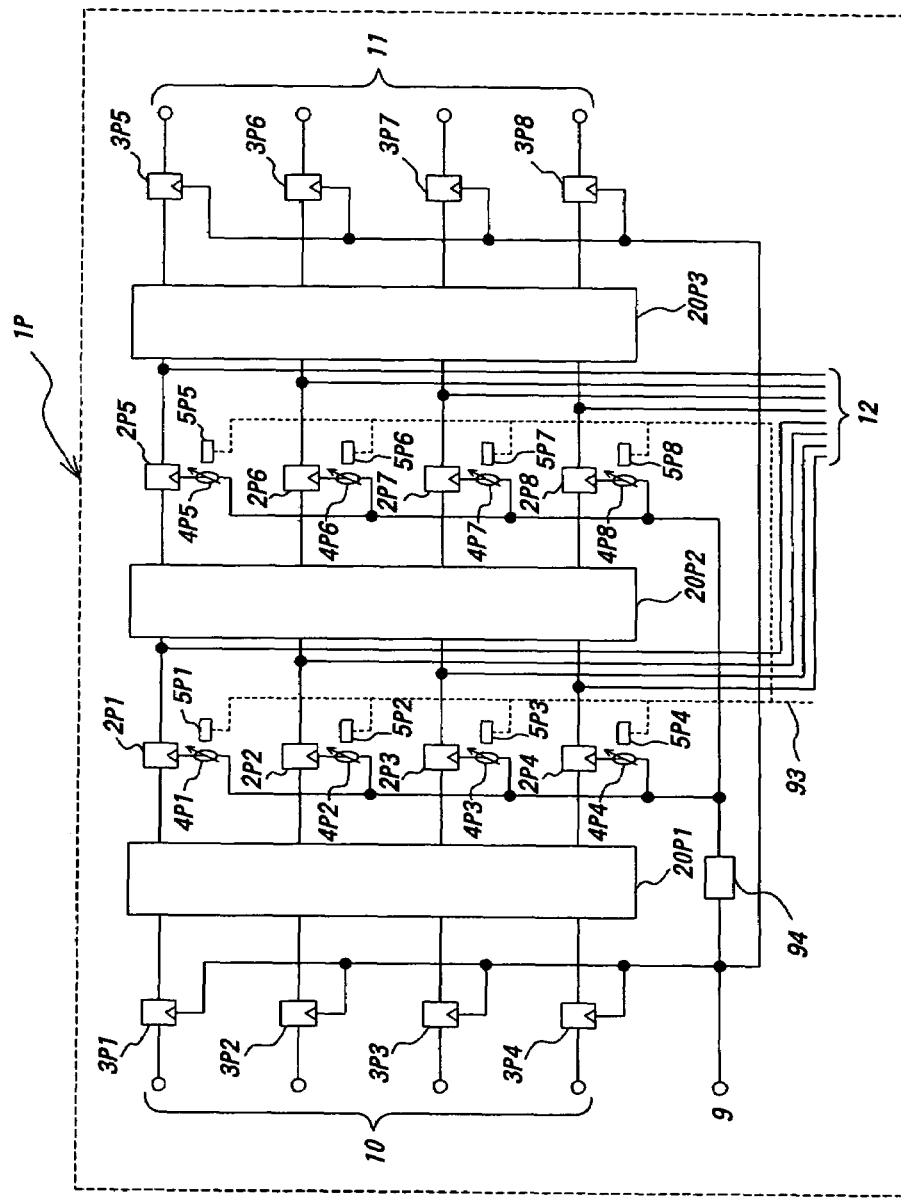
FIG. 30 is a composition diagram schematically showing a digital system having a pipeline structure as a third embodiment of a digital system of the present invention.

Next, a composition example of a digital system having a pipeline structure as a third embodiment of the present invention is shown. FIG. 30 shows the composition of a digital system having a pipeline structure of the third embodiment, and in FIG. 30, symbol 1P is a digital system having a pipeline structure, and the system of this embodiment is composed of a digital system 1P which performs a similar function to the digital system 1 in the first embodiment but has a pipeline structure as a concrete composition instead of being composed of the digital system 1. The same components as those of FIG. 1 are given the same symbols as those.

A pipeline structure is generally a structure in which the outputs of a certain combination circuit are connected to a plurality of flip-flops and the output values of the combination circuit are not influenced by the output values of the flip-flops. The digital system 1P having this pipeline structure has flip-flops 2P1 to 2P8 and 3P1 to 3P8 which a clock signal 9 is inputted into, and combination circuits 20P1 to 20P3 which a clock signal 9 is not inputted into. Symbols 4P1 to 4P8 are adjustable delay elements, which are respectively adjusted in delay time according to values shown by registers 5P1 to 5P8. In this embodiment, the number of adjusting points is eight.

In FIG. 30, symbol 11 is signal lines for reading digital values held by the flip-flops 3P5 to 3P8 and 12 is signal lines for reading digital values held by the flip-flops 2P1 to 2P8, which are respectively connected to a digital signal observing device 7.

In a digital system having a pipeline structure, in many cases, an incorrect operation is caused by non-uniformity in timing of a clock signal 9 inputted into the flip-flops 3P1 to 3P8 and 2P1 to 2P8 due to impedance mismatching, stray capacity and the like in a clock circuit and the outputs 11 of the digital system having a pipeline structure do not become expected values. As a measure to counter an erroneous operation, therefore, it is effective to adjust a clock signal in timing, but it is necessary to entirely adjust the adjusting points of the delay elements 4P1 to 4P8. Thereupon, from a fact that such a system has features in a dependent relation among data signals due to its pipeline structure, a method for performing adjustment effectively utilizing the features has been invented.

The third embodiment of a method of the present invention for adjusting a digital system 1P having the pipeline structure is described in the following. A method of this embodiment is basically similar to the adjusting method of the first embodiment previously described, but this method adjusts registers in parts and in stages.

Figure 31:
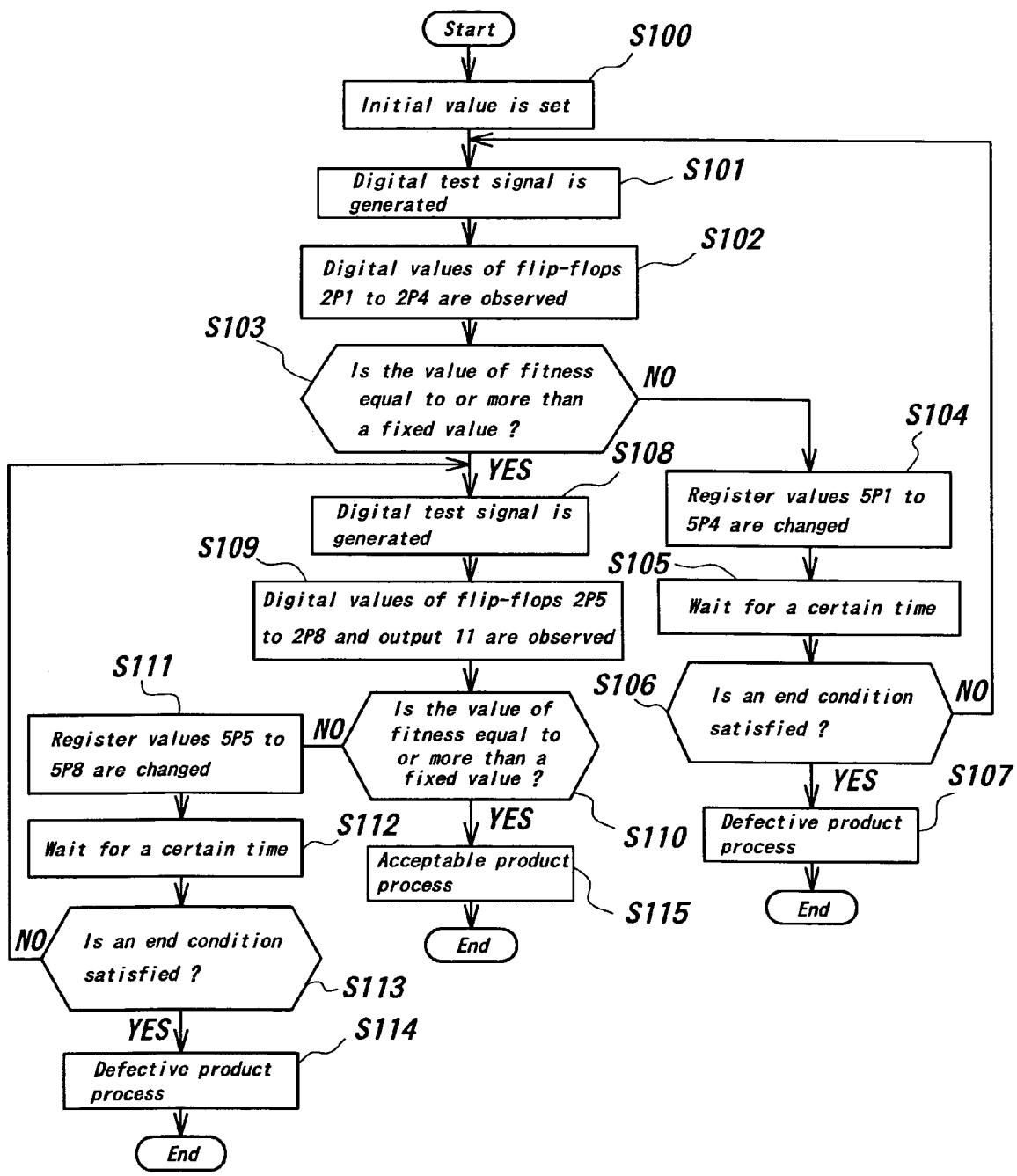
FIG. 31 is a flowchart roughly showing the processing procedure of the third embodiment of a clock signal adjusting method of a digital system of the present invention.

After a digital system 1P having a pipeline structure has been manufactured, in an inspection process, as shown in FIG. 30, an adjusting device 6, a digital signal observing device 7 and a digital test signal generating device 8 are respectively connected to the digital system 1P having a pipeline structure. The digital test signal generating device 8 inputs a test signal 10 and a clock signal 9 into the digital system 1P having a pipeline structure. The digital signal observing device 7 observes and provides the output values of the digital system 1P having a pipeline structure and/or the values of the flip-flops 2P1 to 2P8 to the adjusting device 6. The adjusting device 6 sets the register values of registers 5P1 to 5P8, using a genetic algorithm according to a processing procedure shown in FIG. 31.

In this processing procedure, first in step S100 the adjusting device 6 writes a predetermined initial setting value into a register 5 and makes the register 5 hold it as a register value, in the next step S101 the digital test signal generating device 8 outputs a test signal and makes the digital system 1P operate under input of a clock signal 9 having a fixed frequency in response to this test signal, in the next step S102 the digital signal observing device 9 observes the digital values held by the flip-flops 2P1 to 2P4 and sends the result of observation to the adjusting device 6, and in the next step S103 the adjusting device 6 judges whether the value of fitness is equal to or less than a fixed value, using the observation values sent.

In a case that the value of fitness is equal to or less than a fixed value, in step S104 the adjusting device 6 changes the register values held by the registers 5P1 to 5P4, and in the next step S105, the process waits for a fixed time until the result of change becomes stable. In the next step S106, it is judged whether an end condition has been met, and if the end condition has been met, in step S107 a defective product process is performed and thereafter the process is ended. However, if the end condition is not met, the procedure returns to step S101, and the series of processes is repeatedly performed. In a case that it has been judged that the value of fitness is equal to or more than a fixed value in the step S103, the adjustment of the registers 5P1 to 5P4 is ended and the procedure proceeds to step S108.

In step S108, the digital test signal generating device 8 outputs a test signal and makes the digital system 1P operate in response to this test signal. In the next step S109, the digital signal observing device 9 observes the digital values held by the flip-flops 2P5 to 2P8 and the outputs and sends the result of observation to the adjusting device 6. In the next step S110, the adjusting device 6 judges whether the value of fitness is equal to or less than a fixed value, using the observation values sent.

Hereupon, in a case that the value of fitness is equal to or less than a fixed value, in step S111 the adjusting device 6 changes the register values held by the registers 5P5 to 5P8, and in the next step S112 the process waits for a fixed time until the result of change becomes stable. In the next step S113, it is judged whether an end condition is met, and if the end condition is met, in step S114 a defective product process is performed and thereafter the process is ended. However, if the end condition is not met, the procedure returns to step S108 and this series of processes is repeatedly performed. In a case that it has been judged that the value of fitness is equal to or more than a fixed value in step S110, an acceptable product process is performed in step S115 and thereafter the process is ended.

A processing procedure by a genetic algorithm in this case is the same as that of the first embodiment, and a chromosome in the genetic algorithm and the values of registers have a one-to-one correspondence to each other. That is to say, in adjustment in a loop of steps S101 to S103 a chromosome is composed of four register values corresponding to the four adjusting points of the registers 5P1 to 5P4. In adjustment in a loop of steps S108 to S110 a chromosome is composed of four register values corresponding to the four adjusting points of the registers 5P5 to 5P8. Here, it is assumed that each register corresponding to each adjusting point is of 4 bits. Therefore, the length of a chromosome is 16 bits and accordingly, the size of a partial adjusting and search space in the above-mentioned embodiment is $2^{16}=65536$.

Incidentally, adjustment by a genetic algorithm needs generally a search time being in proportion to the size of the whole adjusting and search space. Hereupon, however, since the adjustment of a digital system 1P is divided into adjustment of the registers 5P1 to 5P4 and adjustment of the registers 5P5 to 5P8 paying attention to a dependent relation among data of a pipeline structure as described above, the size of the whole adjusting and search space becomes $65536 \times 2=131072$ and therefore can be dramatically reduced in comparison with the size $2^{(16+16)} \approx 10^9$ (10 to the 9th power) in case of adjusting all the registers at the same time.

The adjusting device 6 in this case performs evaluation using an evaluation function as shown below for example.

Fitness=*NC/NT* (where *NC/NT*<1)

Fitness=1+1/(1.0+|*DL*|) (where *NC/NT*=1). [Formula 3]

Here, NT is the total number of bits of digital values observed by the digital signal observing device 7 in relation to a series of digital signals 10, and NC is the total number of bits of digital values as expected out of the digital values. Fitness is the degree of fitness in a genetic algorithm, and DL is the sum of delay times of all the delay elements under adjustment. In this evaluation function, a digital system 1P having a pipeline structure is adjusted until it comes to perform no incorrect operation and after it has come to perform no incorrect operation, further it is adjusted so that the sum of the delay values becomes as small as possible. In this case, it is enough to use a value equal to or more than 1.0 as a criterion value for judging the fitness in the steps S103 and S110.

Since the method of this embodiment uses a plurality of adjustable delay elements 4P1 to 4P8 onto a clock signal 9 in a digital system 1P having a pipeline structure and adjusts their delay values so that the digital system 1P does not perform an incorrect operation, it is possible to absorb a slippage in clock timing caused by non-uniformity in processes of clock circuits in a manufacturing process of a digital system having a pipeline structure, errors in design and the like, and adjust a digital system having a pipeline structure 1P so as to perform no incorrect operation. Additionally, since this embodiment can perform adjustment in parts and in stages paying attention to a dependent relation among data of a pipeline structure, it can make its adjusting and search space smaller and the adjusting time shorter.

In this embodiment, a pipeline structure has four stages, but it is a matter of course that the present invention does not care about the number of stages.

Additionally, when adjusting registers in parts, since a partial adjusting and search space is made small in case that the number of data lines is small, an exhaustive search method may be used instead of an adjusting method using a genetic algorithm. For example, in case that the number of registers to be adjusted is two and the number of bits of each register is four, since a partial adjusting and search space is $2^8=256$, it is enough to perform adjustment as examining all possible cases.

Figure 32:
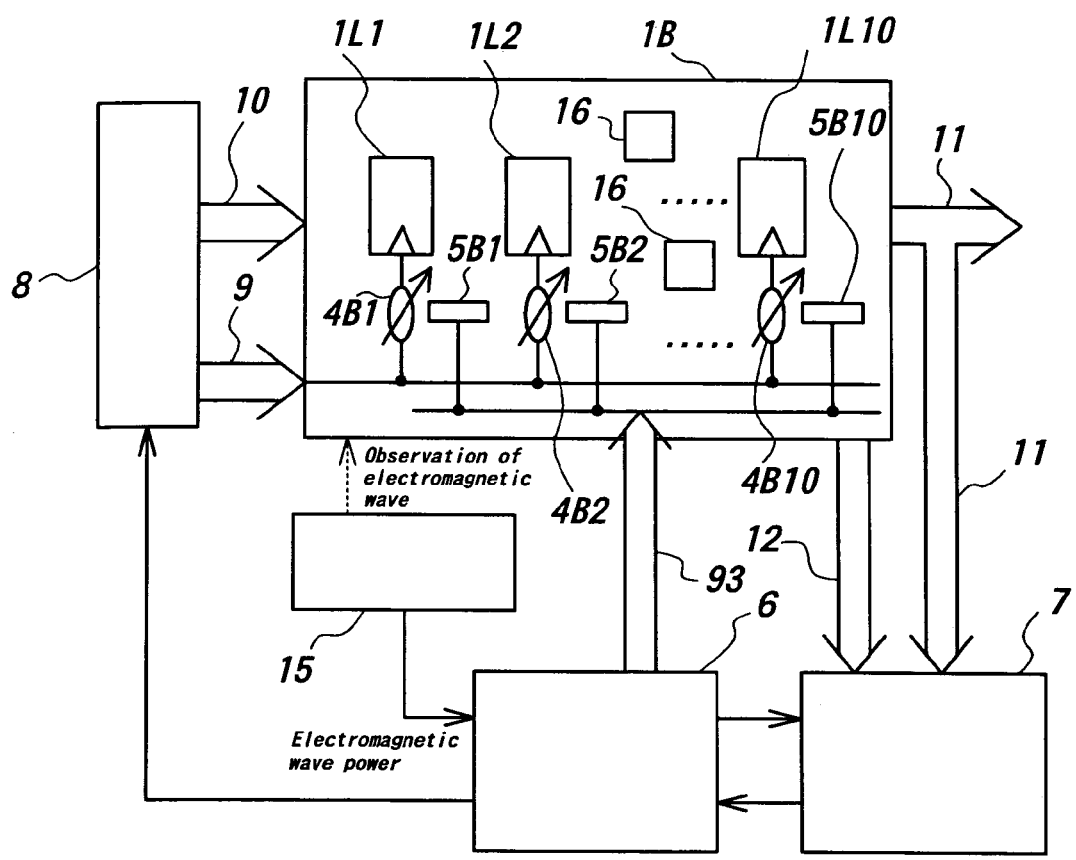
FIG. 32 is a composition diagram schematically showing a digital circuit board as a fourth embodiment of a digital system of the present invention.

Next, a composition example of a digital circuit board as a fourth embodiment of a digital system of the present invention is shown. FIG. 32 shows the composition of a digital circuit board of this fourth embodiment, and in FIG. 32, symbol 1B is a digital circuit board and the system of this embodiment is composed of a digital circuit board 1B which performs a similar function to the digital system 1 in the first embodiment instead of being composed of the digital system 1. The same components as those of FIG. 1 are given the same symbols as those.

A plurality of LSIs 1L1 to 1L10 having a clock signal 9 inputted and a plurality of electronic components 16 having no clock signal inputted are mounted in this digital circuit board 1B. Additionally, these LSIs and electronic components are connected to one another with data signal lines not illustrated. Symbols 4B1 to 4B10 are delay elements being adjustable in delay time, which are respectively adjusted in delay time according to values represented by registers 5B1 to 5B10. In this embodiment, there are ten adjusting points of them. Additionally, symbol 15 is an electromagnetic wave measuring device which is an external device.

In a digital circuit board, in many cases there is an LSI performing an incorrect operation caused by non-uniformity in timing of a clock signal 9 inputted into the LSIs 1L1 to 1L10 due to impedance mismatching, stray capacity and the like in a clock circuit on the board and the output 11 of the digital circuit board does not become an expected value. As a measure to counter an incorrect operation, therefore, it is effective to adjust in timing a clock signal to be given to each LSI, but since data signals of the LSIs 1L1 to 1L10 have a dependent relation among one another, it is necessary to synthetically adjust the adjusting points of the delay elements 4B1 to 4B10.

In a digital circuit board, since a digital signal current containing a harmonic component of a high frequency flows on the board, the power of an electromagnetic noise emitted from the board is large. Therefore, as an EMI noise it exerts influence upon a human body and other electronic devices being in the vicinity of it. This emission noise can be lowered in the peak value of its power by finely shifting in timing a clock to be inputted into each LSI. Accordingly, by observing the emission noise and adjusting a clock timing, it is possible to reduce the influence of the emission noise upon the outside.

The electromagnetic wave measuring device 15 measures the power of an electromagnetic wave emitted from a board, A/D-converts and transmits the value of it to an adjusting device 6. While a digital test signal generating device 8 is outputting a test signal, the adjusting device 6 monitors the electronic wave power and computes the peak value during this period.

The fourth embodiment of a method of the present invention for adjusting the digital circuit board 1B is described. A method of this embodiment is basically similar to the adjusting method of the first embodiment previously described.

After a digital circuit board 1B has been manufactured, in an inspection process, as shown in FIG. 32, an adjusting device 6, a digital signal observing device 7, a digital test signal generating device 8 and an electromagnetic wave measuring device 15 are respectively connected to the digital circuit board 1B. The digital test signal generating device 8 inputs a test signal 10 and a clock signal 9 into the digital circuit board 1B. The digital signal observing device 7 observes and provides the output value of the digital circuit board 1B to the adjusting device 6 and the electromagnetic wave measuring device 15 observes an emission noise of the digital circuit board 1B and provides its value to the adjusting device 6, and the adjusting device 6 performs evaluation using an evaluation function described below for example.

Fitness=*NC/NT* (where *NC/NT*<1)

Fitness=1+1/(1.0+|*P*|(where *NC/NT*=1). [Formula 4]

Here, P is the peak power of a measured electromagnetic wave. In this evaluation function, a digital circuit board 1B is adjusted until it comes to perform no incorrect operation and after it has come to perform no incorrect operation, it is further adjusted so that the peak value of an emission noise power is made as small as possible.

A chromosome and register values in this case have a one-to-one correspondence to each other in the same way as the case of the method of the first embodiment. That is to say, in the same way as shown in FIG. 17, a chromosome is composed of the register values of ten registers corresponding to the ten adjusting points of the embodiment. Here, it is assumed that each register corresponding to each adjusting point is of 4 bits. Therefore, the length of a chromosome is 40 bits. Accordingly, the size of an adjusting and search space of the digital circuit board 1B in the above-mentioned embodiment is $2^{40} \approx 10^{12}$ (10 to the 12th power), and it is a matter of course that adjustment by an exhaustive search is impossible.

Since the method of this embodiment uses a plurality of adjustable delay elements 4B1 to 4B10 onto a clock signal 9 in a digital circuit board 1B and adjusts their delay values so that the digital circuit board 1B does not perform an incorrect operation, it is possible to absorb a slippage in clock timing caused by non-uniformity in components and materials of clock circuits in a digital circuit board manufacturing process, errors in design and the like, and adjust a digital circuit board 1B so as to perform no incorrect operation.

Additionally, since this embodiment can perform adjustment in consideration of an emission noise emitted as an electromagnetic wave from a digital circuit board 1B, this embodiment is preferable particularly in case that there are a human body and other electronic devices around the digital circuit board 1B.

In this embodiment, the number of LSIs mounted on a board is ten, but it is a matter of course that the present invention does not care about the number of LSIs. It is a matter of course that it is not necessary to consider the value of P in the evaluation function in such a case which does not care about the power of an emission noise as a case that there are not a human body and other electronic devices around the circuit board.

The method of this embodiment is preferable particularly in case that a clock frequency is high. The reason is that in case that a clock frequency is higher, to adjust a clock signal in timing becomes more difficult and the power of a high-frequency component of an electromagnetic emission noise becomes stronger.

In the first to fourth embodiments described above, a genetic algorithm has been used as a method for setting the initial set value of a register 5 and a method for changing a register value from the initial set value. In case that clock signal lines form a tree structure, however, an algorithm called a genetic programming can be used in place of a genetic algorithm.

For more information about a genetic programming, refer to, for example, "Genetic Programming" written by J. Koza, published by MIT Press in 1992. A genetic programming is obtained by adding a contrivance which makes it possible to handle a chromosome of a tree structure to a genetic algorithm.

In a digital system and its adjusting method of a fifth embodiment of the present invention described next, an adjusting device 6 changes the value of a register 5 according to such a genetic programming in a system configuration shown in FIG. 33. Particularly, this embodiment is greatly characterized by mapping the tree structure of a clock circuit as it is to the structure of a chromosome of a genetic programming as a chromosome of the genetic programming. By doing so, it is possible to make unnecessary a circuit and the like for converting information of a chromosome into register values in the same way as the first embodiment.

Figure 33:
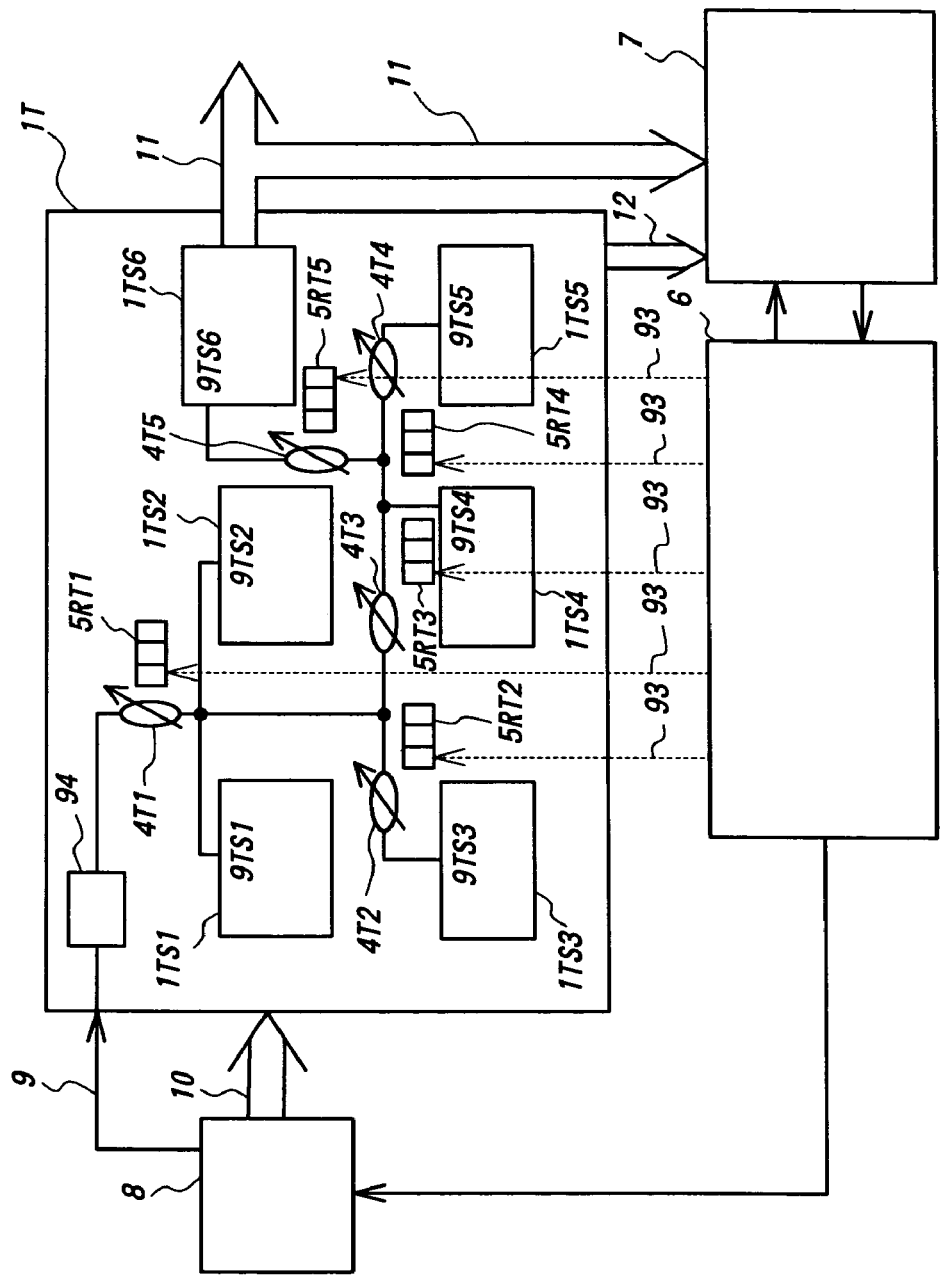
FIG. 33 is a composition diagram schematically showing a fifth embodiment of a digital system of the present invention.

A digital system 1T shown in FIG. 33 performs a function similar to the digital system 1, but in this digital system 1T a clock signal 9T is inputted into the digital system 1T and it is branched in the shape of a tree structure and inputted into digital subsystems 1TS1 to 1TS6. In these digital subsystems, the clock signal is given to all flip-flops as a clock signal. Delay elements 4T1 to 4T5 are inserted in the respective branches of a clock circuit, and the respective delay values can be changed according to corresponding register values 5RT1 to 5RT5. The digital subsystems are connected to one another through data lines not illustrated.

Next, an adjusting method of the fifth embodiment of the present invention according to a genetic programming is described. This adjusting method follows the flowchart of FIG. 13 in the same way as the first embodiment. And the processing procedure of a genetic programming is the same as the flowchart shown in FIG. 16, but is different only in methods of representation and crossover of a chromosome.

Figure 34:
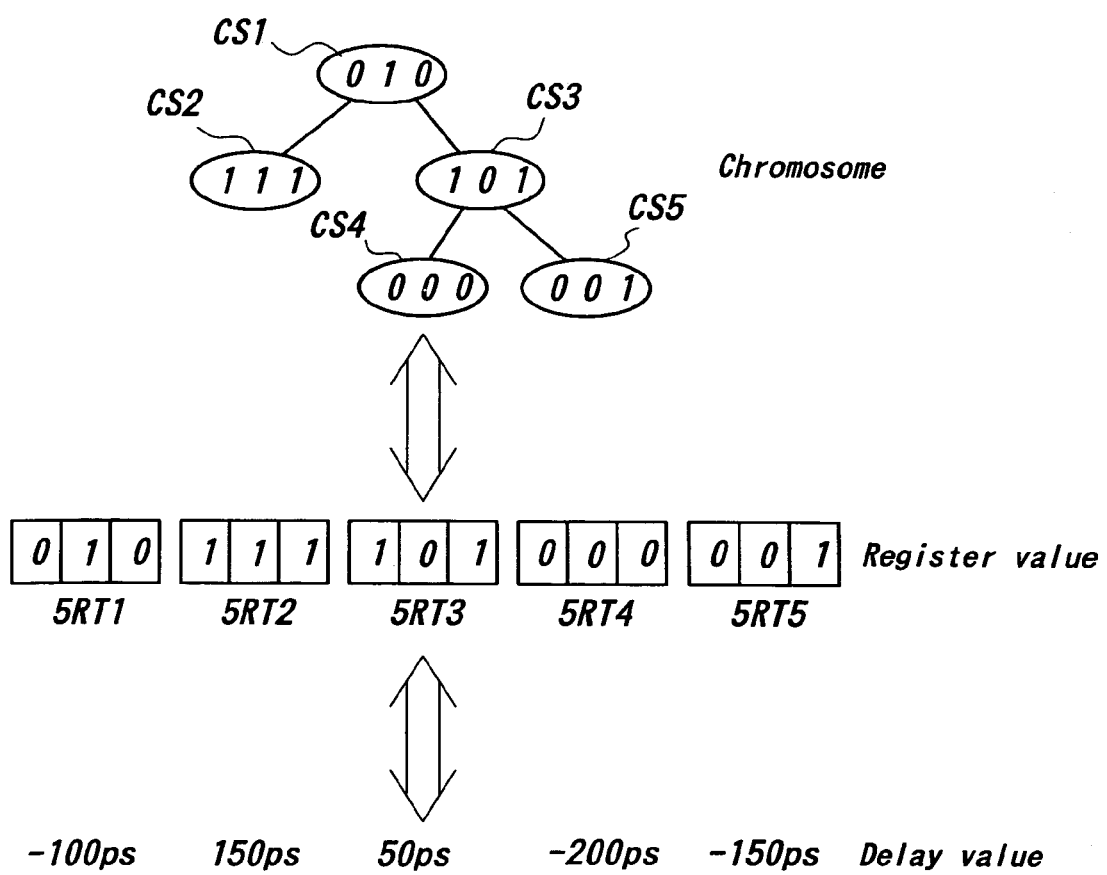
FIG. 34 is an explanatory diagram showing a chromosome used in a genetic programming in the method of the embodiment and register values and delay values determined from the chromosome.

A tree structure shown in FIG. 34 is used as a chromosome of a genetic programming. That is to say, a tree structure representing the connection state of a clock circuit shown in FIG. 33 as it is used, and the respective bit strings of nodes CS1 to CS5 of a chromosome correspond to the values of the registers 5RT1 to 5RT5. In FIG. 34 it is assumed that the length of each register is three, but it is a matter of course that this adjusting method can be applied in case of an arbitrary number of bits.

This embodiment uses, as an evaluation function F for individuals in the generic algorithm, a function representing how close a characteristic obtained by a digital signal observing device 9 is to an ideal characteristic, as a result of operating a digital system 1T by using the register values represented by the chromosome of an individual.

For use in the process shown in FIG. 14, a plurality of individuals are generated in advance by using uniform random numbers as the initial population of a genetic programming in step S1 of FIG. 13. Namely, this case means that the value of each gene of each chromosome of the initial population takes a value of 1 at a probability of 0.5 and takes a value of 0 at a probability of 0.5. In case that there is some previous knowledge of the trend of non-uniformity in clock timing, however, individuals being considered to be higher in fitness can be generated as the initial population.

Fitness is computed by the adjusting device 6 using the evaluation function on the basis of observation values sent from the digital signal observing device. After this, it is judged whether the digital system 1T operates correctly in performance in step S23, and in case that the system performs an incorrect operation, this method performs a selection process in step S24, a crossover process in step S5 and a mutation process in step S27, and thereby generates a population of individuals of the next generation (a candidate population for solution).

When it has been judged that the digital system 1T correctly operates in step S23, this method performs an acceptable product process in step S9 and then ends the adjusting process, but in case that a chromosome (register values) correctly operating cannot be obtained even if an adjusting process is repeatedly performed for a certain number of generations, the digital system 1T to be adjusted is judged as defective and the method performs a defective product process in step S8 of FIG. 6.

In the selection process of step S24, the flowchart of FIG. 16 is used in the same way as in the first embodiment.

Figure 35:
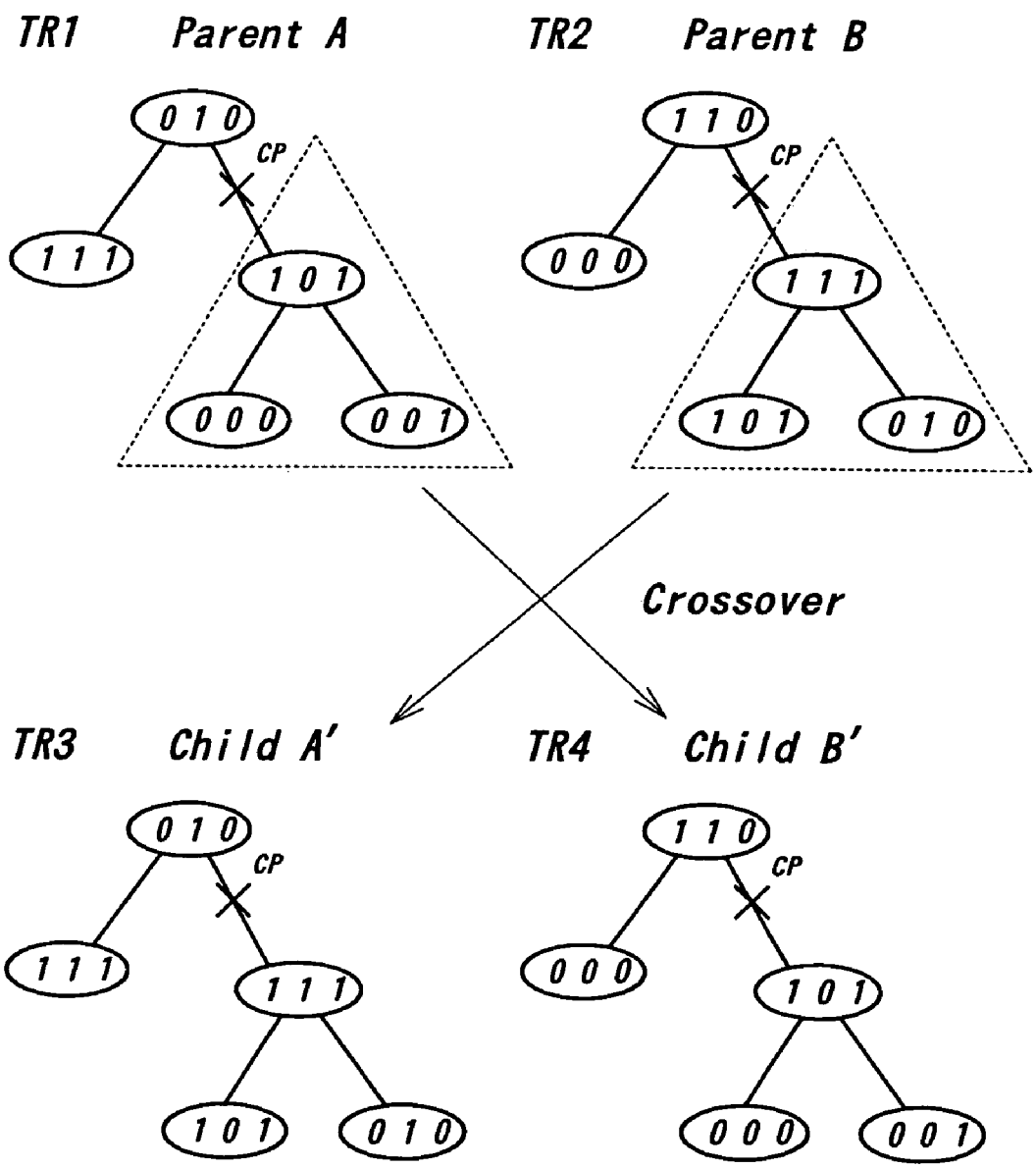
FIG. 35 is an explanatory diagram showing the procedure of a crossover process performed by a genetic programming in the method of the embodiment.

In the crossover process of step S25, a method shown in an explanatory diagram of FIG. 35 is used. This is an operation for replacing parts at random positions in the tree structure of a chromosome, and is an operation specific to a genetic programming. In FIG. 35, symbols TR1 and TR2 are chromosomes of parents A and B which have survived as a result of selection, and in a crossover process in this case, these chromosomes are cut at crossover positions CP selected at random. And a child A' and a child B' respectively having chromosomes TR3 and TR4 are generated by replacing partial gene patterns obtained by the cutting, and the original individuals A and B are replaced with these. By using this method, it is possible to perform a crossover process without destroying partial information of a chromosome effective for adjustment.

Figure 36:
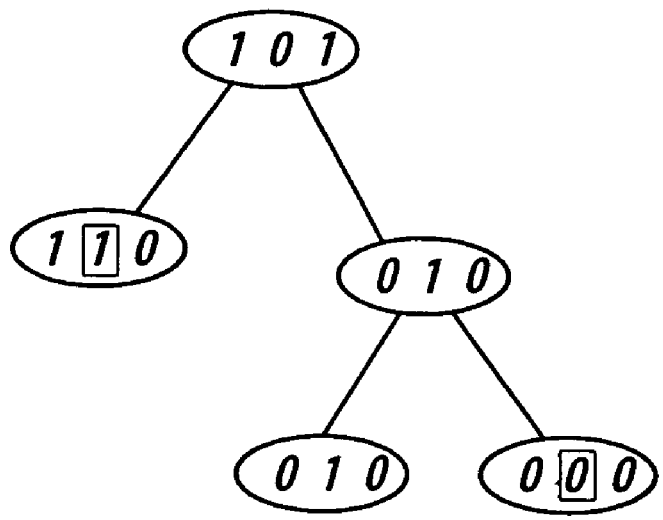
FIG. 36 is an explanatory diagram showing the procedure of a mutation process performed by a genetic programming in the method of the embodiment.
Figure 36:
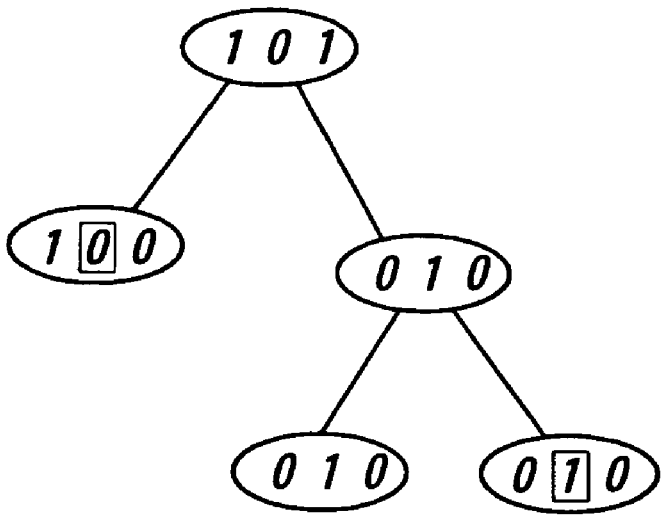

A mutation process of the step S26 performed following the crossover in step S25 is an operation of changing each bit of a gene of each chromosome from 0 to 1 or from 1 to 0 at an occurrence probability of a mutation rate. FIG. 36 shows an example of mutation. In this figure, mutation has occurred in genes enclosed by tetragons of a chromosome TR5 and they are changed respectively into alleles in a chromosome TR6.

In a general genetic programming, genetic operations of inserting and removing a tree structure are also performed in addition to crossover and mutation.

Since those operations change the length of a chromosome, however, when using those operations it is not possible to convert information of a chromosome directly into register values and therefore those operations are not used in this embodiment.

According to this embodiment, it is possible to effectively perform adjustment by means of said genetic programming when a clock circuit is of a tree structure.

It is a matter of course that the present invention can be applied to any of the whole, a part and plural parts of a device using a digital system and does not depend on the scale of a digital system.

A method of the present invention has hardly any hindrance even in case that the delay values of adjustable delay elements 4 are low in accuracy and are not guaranteed in monotonicity. Therefore, a delay element used in the present invention can be made in a smaller area on a semiconductor substrate than that of the prior art.

The present invention has been described above with reference to the illustrated embodiments, but the present invention is not limited to the above-mentioned examples and includes other compositions into which persons in this field can easily modify and alter these embodiments within the scope as defined in the claims.

What is claimed is:

1. A digital system that performs a specified basic function by operating a plurality of mutually interdependent flip-flops to perform digital processing according to one or more clock signals, comprising:
    a plurality of delay elements which are inserted respectively in a plurality of clock circuits that supply said clock signals in said digital system and each of which is composed of a circuit element that changes a delay time according to a value indicated by a control signal, and
    a plurality of holding circuits that hold a plurality of control signals to be given to said plurality of delay elements, wherein;
    said plurality of control signals having values that are changed by an external device, by (i) inputting a test signal to said digital system and observing a resultant output of the digital system and a resulting operational environment of the digital system, (ii) evaluating a fitness of the digital system from the observed output and operational environment of the digital system, and (iii) using a probabilistic search technique based on said evaluated fitness of the digital system, so that said basic function of the digital system satisfies a predetermined specification.

2. A digital system according to claim 1, wherein the values of the control signals held by said holding circuits are changed to optimum values for bringing said digital system into a state where said basic function of the digital system satisfies the predetermined specification, said optimum values being values which said external device has searched by changing in order the values of said control signals according to a genetic algorithm.

3. A digital system according to claim 1, wherein said plurality of control signals are changed by said external device while raising the frequency of said clock signal in stages.

4. A digital system according to claim 1, wherein said digital system is composed as an integrated circuit.

5. A digital system according to claim 1, wherein said digital system is composed as a circuit board.

6. A digital system according to claim 1, wherein said operational environment of the digital system is a parameter that can be physically observed.

7. A digital system according to claim 6, wherein said parameter is a current consumption amount of the digital system.

8. A digital system according to claim 6, wherein said parameter is a power of electromagnetic wave dissipated from the digital system.

9. A digital system that performs a specified basic function by operating a plurality of mutually interdependent flip-flops to perform digital processing according to one or more clock signals, comprising:
    a plurality of delay elements which are inserted respectively in a plurality of clock circuits that supply said clock signals in said digital system and each of which is composed of a circuit element that changes a delay time according to a value indicated by a control signal,
    a plurality of holding circuits that hold a plurality of control signals to be given to said plurality of delay circuits, and
    a setting means that changes the values of said plurality of control signals by (i) inputting a test signal to said digital system and observing a resultant output of the digital system and a resulting operational environment of the digital system, (ii) evaluating a fitness of the digital system from the observed output and operational environment of the digital system, and (iii) using a probabilistic search technique based on said evaluated fitness of the digital system, so that said basic function of the digital system satisfies a predetermined specification.

10. A digital system according to claim 9, wherein said setting means changes in order the values of said control signals according to a genetic algorithm and searches optimum values of said control signals for bringing said digital system into a state where said basic function of the digital system satisfies the predetermined specification.

11. A digital system according to claim 9, wherein said plurality of control signals are changed by said setting means while raising the frequency of said clock signal in stages.

12. A digital system according to claim 9, wherein said digital system is composed as an integrated circuit.

13. A digital system according to claim 9, wherein said digital system is composed as a circuit board.

14. A digital system according to claim 9, wherein said operational environment of the digital system is a parameter that can be physically observed.

15. A digital system according to claim 14, wherein said parameter is a current consumption amount of the digital system.

16. A digital system according to claim 14, wherein said parameter is a power of electromagnetic wave dissipated from the digital system.

17. A method for adjusting timing of one or more clock signals of a digital system that performs a specified basic function by operating a plurality of mutually interdependent flip-flops to perform digital processing according to said clock signals, said method comprising the steps of:
inserting a plurality of delay elements respectively in a plurality of clock circuits that supply said clock signals in said digital system,
forming said plurality of delay elements respectively out of circuit elements each changing a delay time according to a value indicated by a control signal,
holding a plurality of control signals to be given to said plurality of delay elements in a plurality of holding circuits provided in said digital system, and
changing the values of said plurality of control signals by an external device, by (i) inputting a test signal to said digital system and observing a resultant output of the digital system and a resulting operational environment of the digital system, (ii) evaluating a fitness of the digital system from the observed output and operational environment of the digital system, and (iii) using a probabilistic search technique based on said evaluated fitness of the digital system, so that said basic function of the digital system satisfies a predetermined specification.

18. A method for adjusting a clock signal of a digital system according to claim 17, wherein said external device changes in order the values of said control signals according to a genetic algorithm and searches optimum values of said control signals for bringing said digital system into a state where said basic function of the digital system satisfies the predetermined specification.

19. A method for adjusting a clock signal of a digital system according to claim 17, wherein changing said plurality of control signals by said external device is performed while raising the frequency of said clock signal in stages.

20. A method for adjusting a clock signal of a digital system according to claim 17, wherein said digital system is composed as an integrated circuit.

21. A method for adjusting a clock signal of a digital system according to claim 17, wherein said digital system is composed as a circuit board.

22. A method for adjusting a clock signal of a digital system according to claim 17, wherein said operational environment of the digital system is a parameter that can be physically observed.

23. A method for adjusting a clock signal of a digital system according to claim 22, wherein said parameter is a current consumption amount of the digital system.

24. A method for adjusting a clock signal of a digital system according to claim 22, wherein said parameter is a power of electromagnetic wave dissipated from the digital system.

25. A method for adjusting a clock signal of a digital system according to claim 17, wherein said external device is composed of an electronic computer.

26. A recording medium on which is recorded a processing program that is executed by said electronic computer in a method for adjusting a clock signal of a digital system according to claim 17, and changes the values of said plurality of control signals held by said plurality of holding circuits according to a probabilistic search technique so that said basic function of the digital system satisfies the predetermined specification.

27. A method for adjusting timing of a one or more clock signals of a digital system that performs a specified basic function by operating a plurality of mutually interdependent flip-flops to perform digital processing according to said clock signals, said method comprising the steps of:
inserting a plurality of delay elements respectively in a plurality of clock circuits that supply said clock signals in said digital system,
forming said plurality of delay elements respectively out of circuit elements each changing a delay time according to a value indicated by a control signal,
holding a plurality of control signals to be given to said plurality of delay elements in a plurality of holding circuits provided in said digital system, and
changing the values of said plurality of control signals by a setting means provided in said digital system, by (i) inputting a test signal to said digital system and observing a resultant output of the digital system and a resulting operational environment of the digital system, (ii) evaluating a fitness of the digital system from the observed output and operational environment of the digital system, and (iii) using a probabilistic search technique based on said evaluated fitness of the digital system, so that said basic function of the digital system satisfies a predetermined specification.

28. A method for adjusting a clock signal of a digital system according to claim 27, wherein said setting means changes in order the values of said control signals according to a genetic algorithm and searches optimum values of said control signals for bringing said digital system into a state where said basic function of the digital system satisfies the predetermined specification.

29. A method for adjusting a clock signal of a digital system according to claim 27, wherein said plurality of control signals are changed by said setting means while raising the frequency of said clock signal in stages.

30. A method for adjusting a clock signal of a digital system according to claim 27, wherein said digital system is composed as an integrated circuit.

31. A method for adjusting a clock signal of a digital system according to claim 27, wherein said digital system is composed as a circuit board.

32. A method for adjusting a clock signal of a digital system according to claim 27, wherein said operational environment of the digital system is a parameter that can be physically observed.

33. A method for adjusting a clock signal of a digital system according to claim 32, wherein said parameter is a current consumption amount of the digital system.

34. A method for adjusting a clock signal of a digital system according to claim 32, wherein said parameter is a power of electromagnetic wave dissipated from the digital system.

35. A method for adjusting a clock signal of a digital system according to claim 27, wherein said setting means is composed of an electronic computer.

36. A recording medium on which is recorded a processing program that is executed by said electronic computer in a method for adjusting a clock signal of a digital system according to claim 27, and changes the values of said plurality of control signals held by said plurality of holding circuits according to a probabilistic search technique so that said basic function of the digital system satisfies the predetermined specification.

* * * * *